US011359908B2

(12) United States Patent
Cai et al.

(10) Patent No.: US 11,359,908 B2
(45) Date of Patent: Jun. 14, 2022

(54) ANGLE SENSOR SYSTEM

(71) Applicant: TDK CORPORATION, Tokyo (JP)

(72) Inventors: Yongfu Cai, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 75 days.

(21) Appl. No.: 16/527,117

(22) Filed: Jul. 31, 2019

(65) Prior Publication Data
US 2020/0088507 A1 Mar. 19, 2020

(30) Foreign Application Priority Data

Sep. 19, 2018 (JP) .............................. JP2018-174393

(51) Int. Cl.
| | |
|---|---|
| *G01B 7/30* | (2006.01) |
| *G01B 7/00* | (2006.01) |
| *G01R 33/09* | (2006.01) |
| *G01R 33/07* | (2006.01) |
| *G01R 33/00* | (2006.01) |

(52) U.S. Cl.
CPC .............. *G01B 7/30* (2013.01); *G01B 7/003* (2013.01); *G01R 33/07* (2013.01); *G01R 33/09* (2013.01); *G01R 33/0011* (2013.01)

(58) Field of Classification Search
CPC ........... G01D 5/145; G01B 7/30; G01B 7/003
See application file for complete search history.

(56) References Cited

U.S. PATENT DOCUMENTS

| | | | | |
|---|---|---|---|---|
| 6,479,987 | B1 * | 11/2002 | Marx ....................... | G01B 7/30 324/207.12 |
| 8,125,216 | B2 * | 2/2012 | Thomas ............... | G01D 5/2448 324/207.2 |
| 2010/0176804 | A1 * | 7/2010 | Ausserlechner ....... | G01D 5/145 324/207.25 |

(Continued)

FOREIGN PATENT DOCUMENTS

| | | |
|---|---|---|
| CN | 107870002 A | 4/2018 |
| JP | 63-31776 B1 | 5/2018 |

OTHER PUBLICATIONS

Translation of Apr. 6, 2021 Office Action issued in Chinese Patent Application No. 201910887182.1.

*Primary Examiner* — Noam Reisner
(74) *Attorney, Agent, or Firm* — Oliff PLC

(57) ABSTRACT

A magnetic field generator generates a detection-target magnetic field related to an angle to be detected. An angle sensor includes a first and a second magnetic sensor and a processor. The first magnetic sensor detects, at a first detection position, a first applied magnetic field including the detection-target magnetic field, and generates first detection information having a correspondence with the angle to be detected. The second magnetic sensor detects, at a second detection position, a second applied magnetic field including the detection-target magnetic field, and generates second detection information having a correspondence with the angle to be detected. The processor generates an angle detection value by performing arithmetic processing using the first and second detection information. The ratio of a strength of the detection-target magnetic field at the second detection position to a strength of the detection-target magnetic field at the first detection position is 1.65 or more.

13 Claims, 14 Drawing Sheets

(56) References Cited

U.S. PATENT DOCUMENTS

| | | |
|---|---|---|
| 2012/0176126 A1 | 7/2012 | Naganuma et al. |
| 2014/0015384 A1* | 1/2014 | Someya .................. G01B 7/30 |
| | | 310/68 B |
| 2018/0087927 A1 | 3/2018 | Anagawa et al. |
| 2018/0238711 A1* | 8/2018 | Zimmer ................. G01D 5/145 |
| 2018/0274896 A1 | 9/2018 | Anagawa et al. |
| 2018/0274898 A1 | 9/2018 | Uchida et al. |
| 2019/0242691 A1 | 8/2019 | Uchida et al. |
| 2020/0116527 A1 | 4/2020 | Anagawa et al. |

* cited by examiner

ANGLE SENSOR SYSTEM

BACKGROUND OF THE INVENTION

1. Field of the Invention

The present invention relates to an angle sensor system for generating an angle detection value having a correspondence with an angle to be detected.

2. Description of the Related Art

In recent years, angle sensors have been widely used in various applications, such as detection of the rotational position of a steering wheel or a power steering motor in an automobile. The angle sensors generate an angle detection value having a correspondence with an angle to be detected. Examples of the angle sensors include a magnetic angle sensor. An angle sensor system using a magnetic angle sensor is typically provided with a magnetic field generator for generating a magnetic field to be detected, the direction of which rotates in response to the rotation or linear movement of an object. Hereinafter, a magnetic field to be detected will be referred to as a detection-target magnetic field. The magnetic field generator is a magnet, for example. The angle to be detected by the magnetic angle sensor has a correspondence with an angle that the direction of the detection-target magnetic field at a reference position forms with respect to a reference direction.

Among known magnetic angle sensors is one that includes a plurality of detection circuits for generating a plurality of detection signals of different phases and generates an angle detection value by performing arithmetic operations using the plurality of detection signals, as disclosed in US 2012/0176126 A1, US 2018/0087927 A1, and US 2018/0274896 A1. Each of the plurality of detection circuits detects a detection-target magnetic field. Each of the plurality of detection circuits includes at least one magnetic detection element.

In some magnetic angle sensors, as described in US 2018/0087927 A1 and US 2018/0274896 A1, each detection circuit may be subjected not only to a detection-target magnetic field but also to a noise magnetic field other than the detection-target magnetic field. Examples of the noise magnetic field include the earth's magnetic field and a leakage magnetic field from a motor. When subjected to such a noise magnetic field, each detection circuit detects a composite magnetic field of the detection-target magnetic field and the noise magnetic field. When the detection-target magnetic field and the noise magnetic field are in different directions, some error occurs in the angle detection value. The error occurring in the angle detection value will hereinafter be referred to as angle error.

US 2018/0087927 A1 and US 2018/0274896 A1 describe a technology to detect the composite magnetic field of the detection-target magnetic field and the noise magnetic field at a plurality of detection positions and use the detection information to generate an angle detection value with reduced error caused by the noise magnetic field. The detection-target magnetic field has different strengths at the plurality of detection positions.

According to the technology described in US 2018/0087927 A1 and US 2018/0274896 A1, the use of the detection information from two magnetic sensors disposed at two different positions enables generation of an angle detection value with reduced error caused by the noise magnetic field. However, investigations by the inventor of the present invention have shown that the effect varies depending on the layout of the two magnetic sensors.

SUMMARY OF THE INVENTION

It is an object of the present invention to provide an angle sensor system that effectively reduces angle error caused by a noise magnetic field by using two magnetic sensors.

An angle sensor system of the present invention includes a magnetic field generator and an angle sensor. The magnetic field generator generates a detection-target magnetic field, which is a magnetic field to be detected and is related to an angle to be detected. The angle sensor detects the detection-target magnetic field and generates an angle detection value having a correspondence with the angle to be detected.

The angle sensor includes a first magnetic sensor, a second magnetic sensor, and a processor. The first magnetic sensor detects, at a first detection position, a first applied magnetic field including the detection-target magnetic field, and generates first detection information having a correspondence with the angle to be detected. The second magnetic sensor detects, at a second detection position, a second applied magnetic field including the detection-target magnetic field, and generates second detection information having a correspondence with the angle to be detected. The processor generates the angle detection value by performing arithmetic processing using the first detection information and the second detection information.

At each of the first and second detection positions, the direction of the detection-target magnetic field changes with the angle to be detected. The detection-target magnetic field has a first strength at the first detection position and a second strength at the second detection position, and the ratio of the second strength to the first strength is 1.65 or more.

In the angle sensor system of the present invention, the ratio of the second strength to the first strength may be 4 or less.

In the angle sensor system of the present invention, a rotating field angle may have a correspondence with the angle to be detected, and the angle detection value may have a correspondence with the rotating field angle. The rotating field angle is an angle that the direction of the detection-target magnetic field at a reference position forms with respect to a reference direction in a reference plane. In such a case, the first detection information may have a correspondence with an angle that the direction of a first applied field component forms with respect to the reference direction, the first applied field component being a component of the first applied magnetic field parallel to the reference plane, and the second detection information may have a correspondence with an angle that the direction of a second applied field component forms with respect to the reference direction, the second applied field component being a component of the second applied magnetic field parallel to the reference plane.

The first detection information may include a first detection value having a correspondence with the cosine of the angle that the direction of the first applied field component forms with respect to the reference direction, and a second detection value having a correspondence with the sine of the angle that the direction of the first applied field component forms with respect to the reference direction. The second detection information may include a third detection value having a correspondence with the cosine of the angle that the direction of the second applied field component forms with respect to the reference direction, and a fourth detection value having a correspondence with the sine of the angle that the direction of the second applied field component forms with respect to the reference direction.

The first detection position and the second detection position may be in the reference plane.

In the angle sensor system of the present invention, the magnetic field generator may include a magnetic structure formed of a magnetic material, the magnetic structure having a magnetization in a direction perpendicular to a rotation axis and rotating around the rotation axis. In such a case, the first detection position and the second detection position may be located on the same side of the magnetic structure in a direction parallel to the rotation axis, and at different distances from the rotation axis. Further, in such a case, the magnetic structure may include a first portion and a second portion coupled to each other. The second portion is located between the first portion and the first and second detection positions in the direction parallel to the rotation axis. In such a case, the second portion may include a cavity through which the rotation axis passes, whereas the first portion does not include any cavity through which the rotation axis passes.

The first portion may be shaped like a circular plate. The second portion has an outer periphery and an inner periphery each of which may have a circular shape in any cross section of the second portion perpendicular to the rotation axis.

When the magnetic structure includes the first portion and the second portion, the magnetic structure may be formed in its entirety of a hard magnetic material. Alternatively, the first portion may include a soft magnetic material portion formed of a soft magnetic material and a hard magnetic material portion formed of a hard magnetic material. The hard magnetic material portion includes an accommodation portion through which the rotation axis passes, and the soft magnetic material portion is accommodated in the accommodation portion.

When the magnetic structure includes the first portion and the second portion, as viewed in the direction parallel to the rotation axis, the first detection position may be located to overlap the cavity of the second portion and the second detection position may be located to overlap the second portion excluding the cavity.

According to the present invention, the ratio of the strength of the detection-target magnetic field at the second detection position to the strength of the detection-target magnetic field at the first detection position is 1.65 or more. This makes it possible to effectively reduce the angle error caused by the noise magnetic field.

Other and further objects, features and advantages of the present invention will appear more fully from the following description.

DETAILED DESCRIPTION OF THE PREFERRED EMBODIMENTS

First Embodiment

Figure 1:
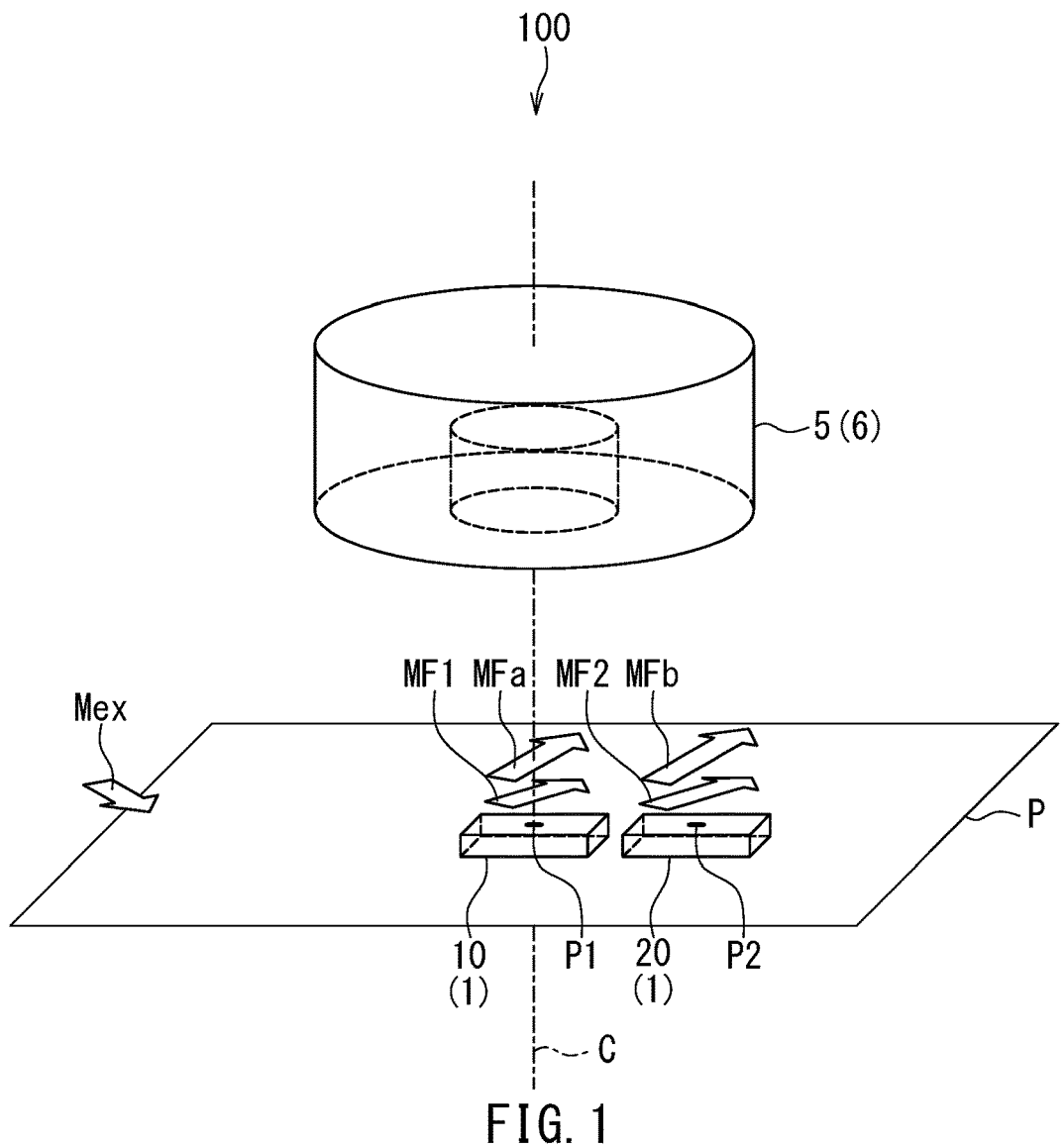
FIG. 1 is a perspective view illustrating a schematic configuration of an angle sensor system according to a first embodiment of the invention.

Preferred embodiments of the present invention will now be described in detail with reference to the drawings. First, reference is made to FIG. 1 to describe a schematic configuration of an angle sensor system according to a first embodiment of the invention. The angle sensor system 100 according to the first embodiment includes an angle sensor 1 according to the first embodiment and a magnetic field generator 5.

The angle sensor 1 is a magnetic angle sensor, in particular.

The magnetic field generator 5 generates a detection-target magnetic field, the detection-target magnetic field being a magnetic field to be detected and being related to an angle to be detected. The magnetic field generator 5 includes a magnetic structure 6 formed of a magnetic material. In the present embodiment, the magnetic structure 6 is formed in its entirety of a hard magnetic material, in particular. The magnetic structure 6 has a magnetization in a direction perpendicular to a rotation axis C, and rotates around the rotation axis C. The shape of the magnetic structure 6 will be described in detail later.

Hereinafter, the angle to be detected will be referred to as a detection-target angle, and denoted by a symbol θ. The detection-target angle θ in the present embodiment is an angle corresponding to the rotational position of the magnetic structure 6.

The angle sensor 1 is configured to detect the detection-target magnetic field and to generate an angle detection value θs having a correspondence with the detection-target angle θ. Hereinafter, an angle that the direction of the detection-target magnetic field at a reference position forms with respect to a reference direction DR in a reference plane P will be referred to as a rotating field angle, and denoted by a symbol θM. The rotating field angle θM has a correspondence with the detection-target angle θ. The rotating field angle θM is identical with the detection-target angle θ if the magnet 5 generates an ideal rotating magnetic field. In the present embodiment, the rotating field angle θM is assumed to be identical with the detection-target angle θ.

The reference plane P is an imaginary plane perpendicular to the rotation axis C, for example. The reference position is in the reference plane P. In the reference plane P the direction of the detection-target magnetic field generated by the magnetic structure 6 rotates around the reference position. The reference direction DR is in the reference plane P and intersects the reference position. In the following description, the direction of the detection-target magnetic field at the reference position refers to a direction in the reference plane P. In FIG. 1 the distance between the magnetic structure 6 and the reference plane P is exaggerated.

The angle detection value θs has a correspondence with the rotating field angle θM. As mentioned above, the rotating field angle θM has a correspondence with the detection-target angle θ. The angle detection value θs thus has a correspondence with the detection-target angle θ.

The angle sensor 1 includes a first magnetic sensor 10 and a second magnetic sensor 20. The first magnetic sensor 10 detects a first applied magnetic field MF1 at a first detection position P1. The first applied magnetic field MF1 includes the detection-target magnetic field. The second magnetic sensor 20 detects a second applied magnetic field MF2 at a second detection position P2. The second applied magnetic field MF2 includes the detection-target magnetic field.

The first and second detection positions P1 and P2 are located on the same side of the magnetic structure 6 in a direction parallel to the rotation axis C. In the present embodiment, both the first and second detection positions P1 and P2 are in the reference plane P. The first and second detection positions P1 and P2 are at different distances from the rotation axis C. In the present embodiment the first and second detection positions P1 and P2 are defined so that they are at different distances from the point of intersection of the reference plane P and the rotation axis C. In the example shown in FIG. 1, the first detection position P1 is the point of intersection of the reference plane P and the rotation axis C, and the second detection position P2 is at a distance from the rotation axis C. Possible positional relationships between the first and second detection positions P1, P2 and the magnetic structure 6 are not limited to the example shown in FIG. 1. For example, the first and second detection positions P1 and P2 may be two positions located at different distances from the magnetic structure 6.

Hereinafter, the detection-target magnetic field at the first detection position P1 will be referred to as a first partial magnetic field MFa, and the detection-target magnetic field at the second detection position P2 will be referred to as a second partial magnetic field MFb. The directions of the first and second partial magnetic fields MFa and MFb change with the detection-target angle θ and the rotating field angle θM. The directions of the first and second partial magnetic fields MFa and MFb are parallel or almost parallel to the reference plane P. Since the first and second detection positions P1 and P2 are different from each other, the first and second partial magnetic fields MFa and Mfb are different from each other in strength.

The angle sensor 1 may be subjected not only to the detection-target magnetic field but also to a noise magnetic field Mex other than the detection-target magnetic field. The direction and strength of the noise magnetic field Mex at the second detection position P2 are respectively the same as the direction and strength of the noise magnetic field Mex at the first detection position P1. The noise magnetic field Mex may be a magnetic field whose direction and strength are temporally constant, a magnetic field whose direction and strength temporally vary in a periodic manner, or a magnetic field whose direction and strength temporally vary in a random fashion.

When the noise magnetic field Mex is applied to the angle sensor 1, the first applied magnetic field MF1 is a composite magnetic field of the first partial magnetic field MFa and the noise magnetic field Mex, and the second applied magnetic field MF2 is a composite magnetic field of the second partial magnetic field MFb and the noise magnetic field Mex.

Figure 2:
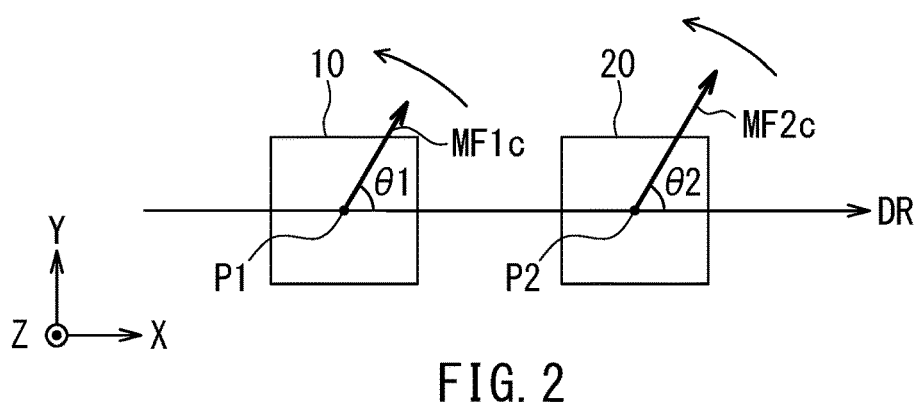
FIG. 2 is an explanatory diagram illustrating the definitions of directions and angles used in the first embodiment of the invention.

Now, definitions of directions and angles used in the present embodiment will be described with reference to FIG. 1 and FIG. 2. First, Z direction is defined as the direction parallel to the rotation axis C shown in FIG. 1 and from bottom to top in FIG. 1. FIG. 2 illustrates the Z direction as the direction out of the plane of the drawing. X and Y directions are defined as two mutually orthogonal directions perpendicular to the Z direction. FIG. 2 illustrates the X direction as the rightward direction, and the Y direction as the upward direction. Further, −X direction refers to the direction opposite to the X direction, and −Y direction refers to the direction opposite to the Y direction.

The rotating field angle θM is expressed with respect to the reference direction DR. In the present embodiment, the reference direction DR is the X direction. Further, in the present embodiment the reference position is the point of intersection of the reference plane P and the rotation axis C.

A component of the first applied magnetic field MF1 parallel to the reference plane P will be referred to as a first applied field component MF1c, and a component of the second applied magnetic field MF2 parallel to the reference plane P will be referred to as a second applied field component MF2c.

It is assumed that the directions of the first and second applied field components MF1c and MF2c both rotate counterclockwise in FIG. 2. As shown in FIG. 2, θ1 represents an angle that the direction of the first applied field component MF1c forms with respect to the reference direction DR, and θ2 represents an angle that the direction of the second applied field component MF2c forms with respect to the reference direction DR. The angles θ1 and θ2 are expressed in positive values when viewed in the counterclockwise direction from the reference direction DR, and in negative values when viewed in the clockwise direction from the reference direction DR.

The main component of the first applied magnetic field MF1 is the first partial magnetic field MFa. The main component of the second applied magnetic field MF2 is the second partial magnetic field MFb. In the following description, the directions of the first and second partial magnetic fields MFa and MFb are assumed to be identical with the direction of the detection-target magnetic field at the reference position. In this case, the respective angles that the first and second partial magnetic fields MFa and MFb form with respect to the reference direction DR are equal to the rotating field angle θM. The positive and negative signs of those angles are defined in the same manner as those of the angles θ1 and θ2.

FIG. 1 illustrates an example in which the reference position and the first detection position P1 are identical. As long as the above-described relationships between the first and second partial magnetic fields MFa and MFb and the detection-target magnetic field at the reference position are satisfied, the reference position may be different from the point of intersection of the reference plane P and the rotation axis C.

Figure 3:
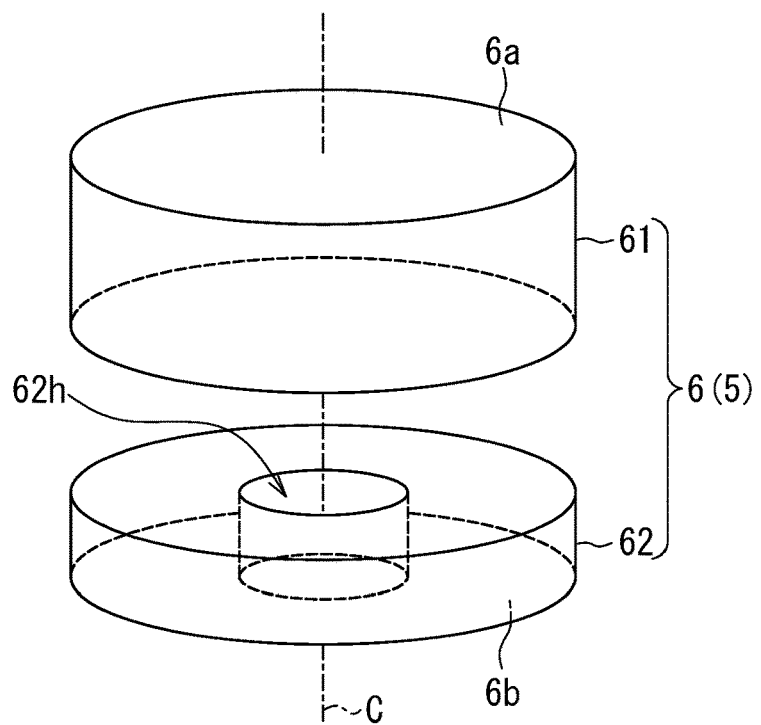
FIG. 3 is an exploded perspective view of a magnetic structure of the first embodiment of the invention.
Figure 4:
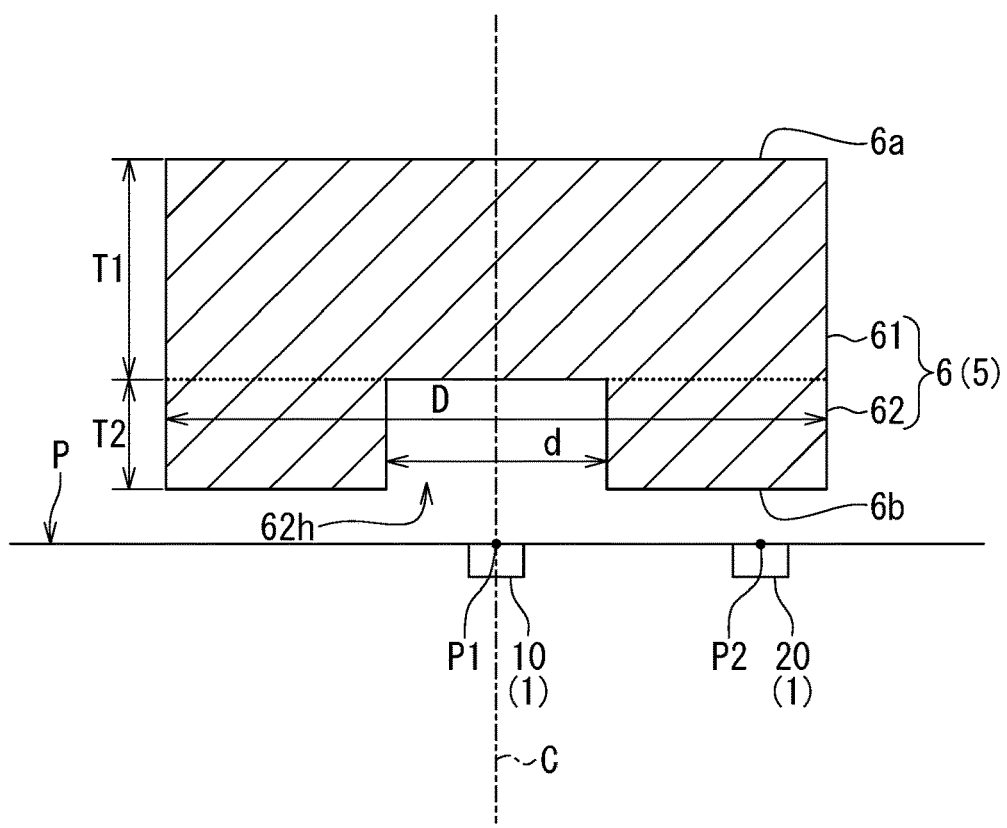
FIG. 4 is a cross-sectional view of the magnetic structure of the first embodiment of the invention.

Reference is now made to FIG. 3 and FIG. 4 to describe the shape of the magnetic structure 6 in detail. FIG. 3 is an exploded perspective view of the magnetic structure 6. FIG. 4 is a cross-sectional view of the magnetic structure 6. The magnetic structure 6 has a first end face 6a and a second end face 6b opposite to each other in a direction parallel to the rotation axis C. The second end face 6b faces the reference plane P. In the present embodiment the first end face 6a and the second end face 6b are both perpendicular to the rotation axis C.

The magnetic structure 6 includes a first portion 61 and a second portion 62 coupled to each other. FIG. 3 depicts the first portion 61 and the second portion 62 as separate from each other. In FIG. 4 the boundary between the first portion 61 and the second portion 62 is shown by dotted lines. The first portion 61 includes the first end face 6a. The second portion 62 includes the second end face 6b.

As shown in FIG. 4, the second portion 62 is located between the first portion 61 and the first and second detection positions P1 and P2 in a direction parallel to the rotation axis C. As shown in FIG. 3 and FIG. 4, the second portion 62 includes a cavity 62h through which the rotation axis C passes, whereas the first portion 61 does not include any cavity through which the rotation axis C passes.

In the present embodiment, the second portion 62 is shaped as follows. The second portion 62 has an outer periphery and an inner periphery each of which has a circular shape centered on the rotation axis C in any cross section of the second portion 62 perpendicular to the rotation axis C. The diameter of the outer periphery of the second portion 62 in the foregoing cross section will hereinafter be referred to as the outer diameter of the second portion 62 and denoted by the symbol D. The diameter of the inner periphery of the second portion 62 in the foregoing cross section will be referred to as the inner diameter of the second portion 62 and denoted by the symbol d. In the present embodiment, both the outer diameter D and the inner diameter d of the second portion 62 are constant regardless of the distance from the second end face 6b. A dimension of the second portion 62 in a direction parallel to the rotation axis C will be referred to as the thickness of the second portion 62 and denoted by the symbol T2.

In the present embodiment, the first portion 61 is shaped like a circular plate with its central axis on the rotation axis C. The diameter of an outer periphery of the first portion 61 in any cross section of the first portion 61 perpendicular to the rotation axis C will be referred to as the outer diameter of the first portion 61. In the present embodiment, the outer diameter of the first portion 61 is constant regardless of the distance from the first end face 6a. A dimension of the first portion 61 in a direction parallel to the rotation axis C will be referred to as the thickness of the first portion 61 and denoted by the symbol T1.

In the example shown in FIG. 4, as viewed in a direction parallel to the rotation axis C, the first detection position P1 is located to overlap the cavity 62h of the second portion 62, and the second detection position P2 is located to overlap the second portion 62 excluding the cavity 62h. Possible positional relationships between the first and second detection positions P1, P2 and the magnetic structure 6 are not limited to the example shown in FIG. 4. For example, as viewed in a direction parallel to the rotation axis C, both the first and second detection positions P1 and P2 may be located to overlap the cavity 62h of the second portion 62.

Figure 5:
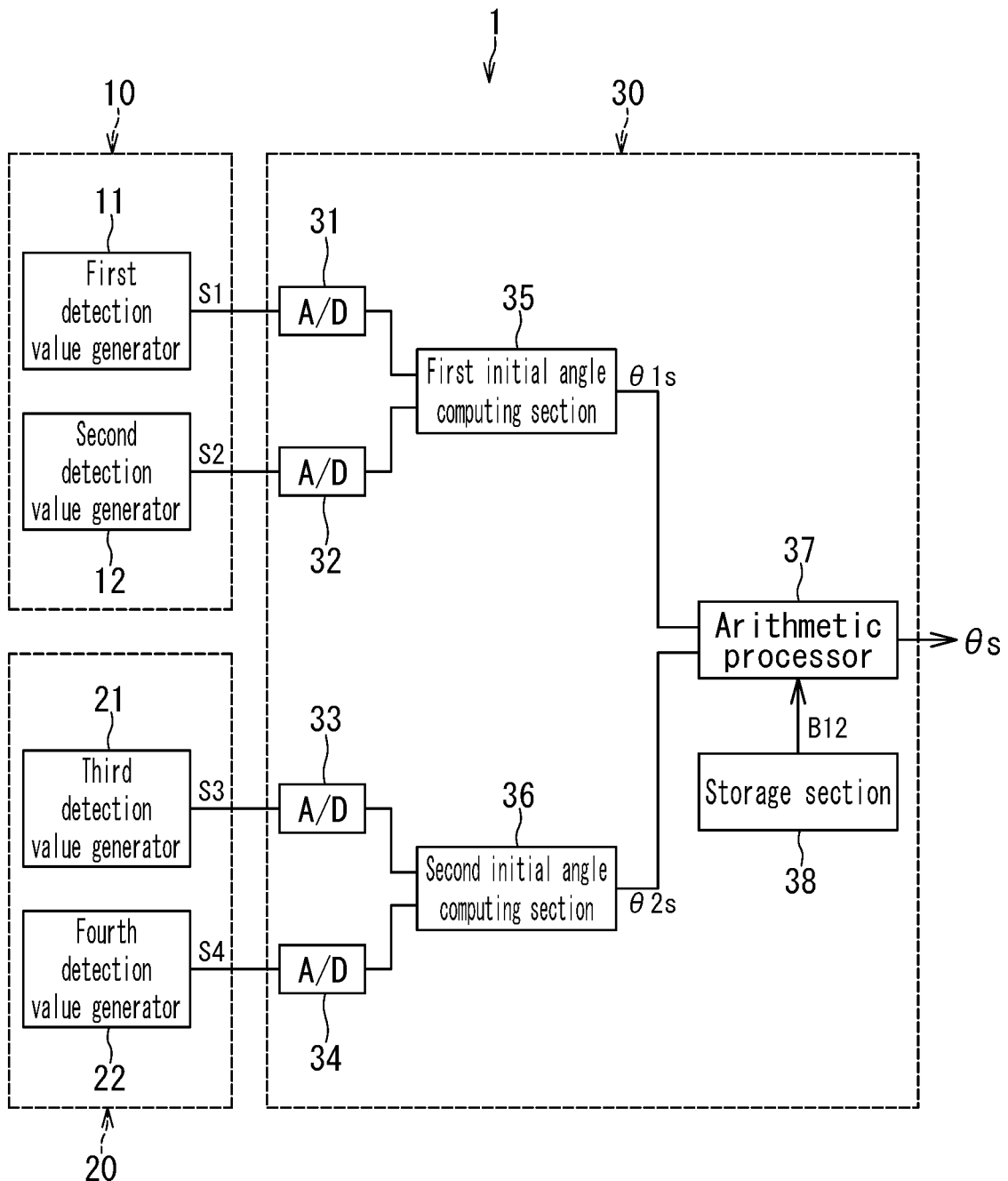
FIG. 5 is a functional block diagram illustrating the configuration of an angle sensor according to the first embodiment of the invention.

Reference is now made to FIG. 5 to describe the configuration of the angle sensor 1 in detail. FIG. 5 is a functional block diagram illustrating the configuration of the angle sensor 1. As previously mentioned, the angle sensor 1 includes the first and second magnetic sensors 10 and 20. The first magnetic sensor 10 generates first detection information having a correspondence with the detection-target angle θ. The first detection information has a correspondence with the angle θ1 that the direction of the first applied field component MF1c forms with respect to the reference direction DR. The second magnetic sensor 20 generates second detection information having a correspondence with the detection-target angle θ. The second detection information has a correspondence with the angle θ2 that the direction of the second applied field component MF2c forms with respect to the reference direction DR.

The first detection information includes a first detection value S1 having a correspondence with the cosine of the angle θ1, and a second detection value S2 having a correspondence with the sine of the angle θ1. The first detection value S1 may have a correspondence with the strength of a component in the X direction of the first applied field component MF1c. The second detection value S2 may have a correspondence with the strength of a component in the Y direction of the first applied field component MF1c.

The second detection information includes a third detection value S3 having a correspondence with the cosine of the angle θ2, and a fourth detection value S4 having a correspondence with the sine of the angle θ2. The third detection value S3 may have a correspondence with the strength of a component in the X direction of the second applied field component MF2c. The fourth detection value S4 may have a correspondence with the strength of a component in the Y direction of the second applied field component MF2c.

The first magnetic sensor 10 includes a first detection value generator 11 for generating the first detection value S1, and a second detection value generator 12 for generating the second detection value S2. The second magnetic sensor 20 includes a third detection value generator 21 for generating the third detection value S3, and a fourth detection value generator 22 for generating the fourth detection value S4.

Each of the first to fourth detection value generators 11, 12, 21 and 22 includes at least one magnetic detection element. The at least one magnetic detection element may include at least one magnetoresistive element. The magnetoresistive element may be a giant magnetoresistive (GMR) element, a tunneling magnetoresistive (TMR) element, or an anisotropic magnetoresistive (AMR) element. The at least one magnetic detection element may further include at least one element other than a magnetoresistive element and configured to detect a magnetic field, such as a Hall element.

As the direction of the detection-target magnetic field rotates with a predetermined period T, the rotating field angle θM varies with the predetermined period T. In this case, all the first to fourth detection values S1 to S4 vary periodically with the period T. The first detection value S1 and the third detection value S3 have the same phase. The second detection value S2 and the fourth detection value S4 have the same phase. The phase of the second detection value S2 is different from the phase of the first detection value S1 by an odd number of times ¼ the period T. The phase of the fourth detection value S4 is different from the phase of the third detection value S3 by an odd number of times ¼ the period T. In the light of the production accuracy of the magnetic detection elements or other factors, the relationships among the phases of the detection values may be slightly different from the above-described relationships.

The angle sensor 1 further includes a processor 30. The processor 30 generates the angle detection value θs by performing arithmetic processing using the first detection information and the second detection information. The processor 30 can be implemented by an application-specific integrated circuit (ASIC) or a microcomputer, for example.

In the present embodiment, the processor 30 includes analog-to-digital converters (hereinafter, "A/D converters") 31, 32, 33 and 34, a first initial angle computing section 35, a second initial angle computing section 36, an arithmetic processor 37, and a storage section 38. The A/D converters 31 and 32 convert the first and second detection values S1 and S2 into digital form, respectively. The first initial angle computing section 35 determines a first initial angle detection value θ1s, which is a detection value of the angle θ1, by performing arithmetic processing using the first and second detection values S1 and S2 converted into digital form by the A/D converters 31 and 32, respectively.

The A/D converters 33 and 34 convert the third and fourth detection values S3 and S4 into digital form, respectively. The second initial angle computing section 36 determines a second initial angle detection value θ2s, which is a detection value of the angle θ2, by performing arithmetic processing using the third and fourth detection values S3 and S4 converted into digital form by the A/D converters 33 and 34, respectively.

The arithmetic processor 37 computes the angle detection value θs using θ1s and θ2s. The methods for computing θ1s, θ2s and θs and the function of the storage section 38 will be described later.

Figure 6:
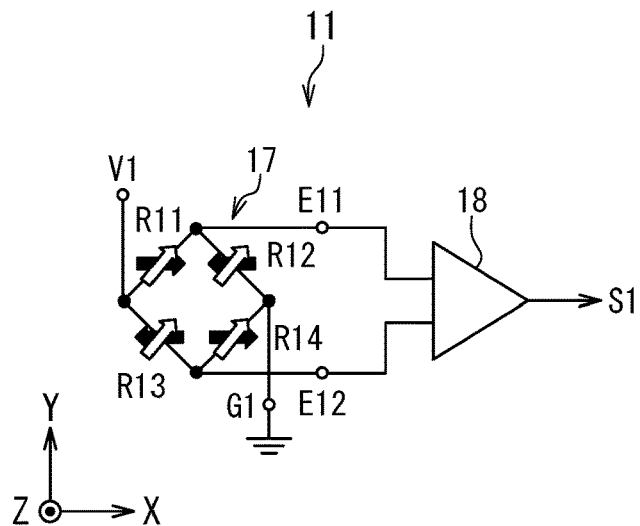
FIG. 6 is a circuit diagram illustrating an example configuration of a first detection value generator of the first embodiment of the invention.

The configuration of the first to fourth detection value generators 11, 12, 21 and 22 will now be described. FIG. 6 illustrates a specific example of configuration of the first detection value generator 11. In this example, the first detection value generator 11 includes a Wheatstone bridge circuit 17 and a difference detector 18. The Wheatstone bridge circuit 17 includes four magnetic detection elements R11, R12, R13 and R14, a power supply port V1, a ground port G1, and two output ports E11 and E12. The magnetic detection element R11 is provided between the power supply port V1 and the output port E11. The magnetic detection element R12 is provided between the output port E11 and the ground port G1. The magnetic detection element R13 is provided between the power supply port V1 and the output port E12. The magnetic detection element R14 is provided between the output port E12 and the ground port G1. A power supply voltage of predetermined magnitude is applied to the power supply port V1. The ground port G1 is connected to the ground.

The third detection value generator 21 has the same configuration as the first detection value generator 11. Thus, in the following description, components of the third detection value generator 21 are denoted by the same reference signs as those used for the components of the first detection value generator 11.

Figure 7:
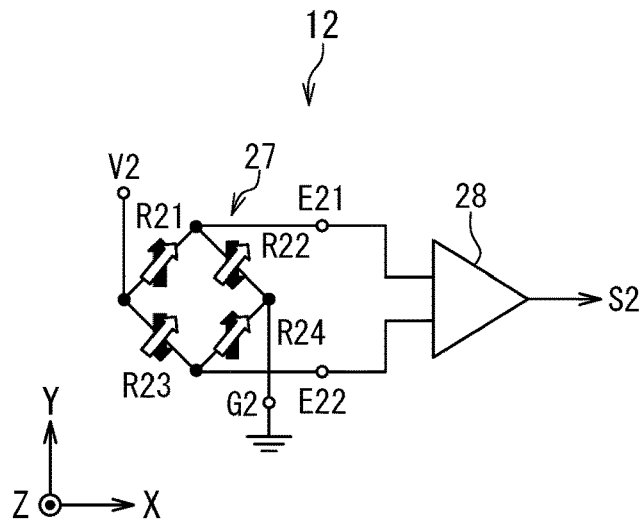
FIG. 7 is a circuit diagram illustrating an example configuration of a second detection value generator of the first embodiment of the invention.

FIG. 7 illustrates a specific example of configuration of the second detection value generator 12. In this example, the second detection value generator 12 includes a Wheatstone bridge circuit 27 and a difference detector 28. The Wheatstone bridge circuit 27 includes four magnetic detection elements R21, R22, R23 and R24, a power supply port V2, a ground port G2, and two output ports E21 and E22. The magnetic detection element R21 is provided between the power supply port V2 and the output port E21. The magnetic detection element R22 is provided between the output port E21 and the ground port G2. The magnetic detection element R23 is provided between the power supply port V2 and the output port E22. The magnetic detection element R24 is provided between the output port E22 and the ground port G2. A power supply voltage of predetermined magnitude is applied to the power supply port V2. The ground port G2 is connected to the ground.

The fourth detection value generator 22 has the same configuration as the second detection value generator 12. Thus, in the following description, components of the fourth detection value generator 22 are denoted by the same reference signs as those used for the components of the second detection value generator 12.

In the present embodiment, each of the magnetic detection elements R11 to R14 and R21 to R24 includes a plurality of magnetoresistive (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction changes with the direction of the detection-target magnetic field, and a nonmagnetic layer located between the magnetization pinned layer and the free layer. The spin-valve MR element may be a TMR element or a GMR element. In the TMR element, the nonmagnetic layer is a tunnel barrier layer. In the GMR element, the nonmagnetic layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In FIG. 6 and FIG. 7, the filled arrows indicate the magnetization directions of the magnetization pinned layers of the MR elements, and the hollow arrows indicate the magnetization directions of the free layers of the MR elements.

In the first detection value generator 11, the magnetization pinned layers of the MR elements included in the magnetic detection elements R11 and R14 are magnetized in the X direction, and the magnetization pinned layers of the MR elements included in the magnetic detection elements R12 and R13 are magnetized in the −X direction. In this case, the potential difference between the output ports E11 and E12 changes with the cosine of the angle θ1. The difference detector 18 outputs a signal corresponding to the potential difference between the output ports E11 and E12 as the first detection value S1. The first detection value S1 thus has a correspondence with the cosine of the angle θ1.

In the second detection value generator 12, the magnetization pinned layers of the MR elements included in the magnetic detection elements R21 and R24 are magnetized in the Y direction, and the magnetization pinned layers of the MR elements included in the magnetic detection elements R22 and R23 are magnetized in the −Y direction. In this case, the potential difference between the output ports E21 and E22 changes with the sine of the angle θ1. The difference detector 28 outputs a signal corresponding to the potential difference between the output ports E21 and E22 as the second detection value S2. The second detection value S2 thus has a correspondence with the sine of the angle θ1.

In the third detection value generator 21, the potential difference between the output ports E11 and E12 changes with the cosine of the angle θ2. The difference detector 18 outputs a signal corresponding to the potential difference between the output ports E11 and E12 as the third detection value S3. The third detection value S3 thus has a correspondence with the cosine of the angle θ2.

In the fourth detection value generator 22, the potential difference between the output ports E21 and E22 changes with the sine of the angle θ2. The difference detector 28 outputs a signal corresponding to the potential difference between the output ports E21 and E22 as the fourth detection value S4. The fourth detection value S4 thus has a correspondence with the sine of the angle θ2.

In the light of the production accuracy of the MR elements and other factors, the magnetization directions of the magnetization pinned layers of the plurality of MR elements in the detection value generators 11, 12, 21 and 22 may be slightly different from the above-described directions.

Figure 8:
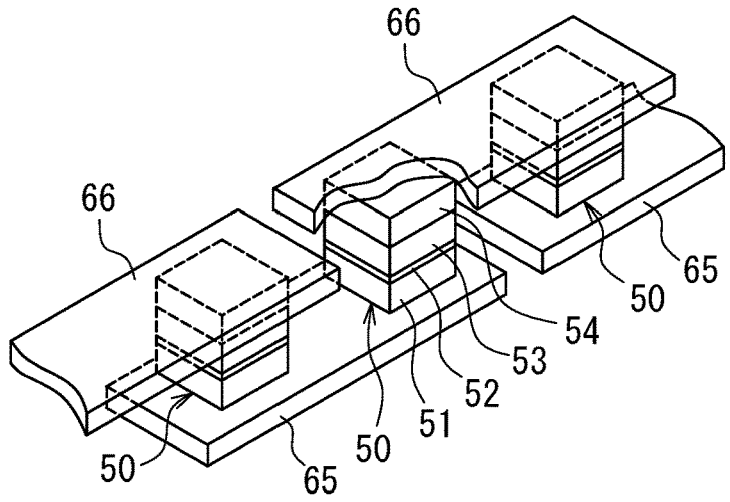
FIG. 8 is a perspective view of part of a magnetic detection element in FIG. 4 and FIG. 5.

An example configuration of the magnetic detection elements will now be described with reference to FIG. 8. FIG. 8 is a perspective view of part of a magnetic detection element in the detection value generators 11 and 12 shown in FIG. 6 and FIG. 7. In this example, the magnetic detection element includes a plurality of lower electrodes 65, a plurality of MR elements 50 and a plurality of upper electrodes 66. The lower electrodes 65 are arranged on a substrate (not illustrated). The lower electrodes 65 each have a long slender shape. Every two lower electrodes 65 that are adjacent to each other in the longitudinal direction of the lower electrodes 65 have a gap therebetween. As shown in FIG. 8, MR elements 50 are provided on the top surface of the lower electrode 65 at positions near opposite ends in the longitudinal direction. Each MR element 50 includes a free layer 51, a nonmagnetic layer 52, a magnetization pinned layer 53, and an antiferromagnetic layer 54 which are stacked in this order, from closest to farthest from the lower electrode 65. The free layer 51 is electrically connected to the lower electrode 65. The antiferromagnetic layer 54 is formed of an antiferromagnetic material, and is in exchange coupling with the magnetization pinned layer 53 to thereby pin the magnetization direction of the magnetization pinned layer 53. The upper electrodes 66 are arranged over the MR elements 50. Each upper electrode 66 has a long slender shape, and establishes electrical connection between the respective antiferromagnetic layers 54 of two adjacent MR elements 50 that are arranged on two lower electrodes 65 adjacent in the longitudinal direction of the lower electrodes 65. With such a configuration, the MR elements 50 in the magnetic detection element shown in FIG. 8 are connected in series by the upper and lower electrodes 66 and 65.

It should be appreciated that the layers 51 to 54 of the MR elements 50 may be stacked in the reverse order to that shown in FIG. 8. Further, the MR element 50 may be configured without the antiferromagnetic layer 54. The configuration may be such that, for example, the antiferromagnetic layer 54 and the magnetization pinned layer 53 are replaced with a magnetization pinned layer of an artificial antiferromagnetic structure, which includes two ferromagnetic layers and a nonmagnetic metal layer interposed between the two ferromagnetic layers.

Next, a method for computing the first and second initial angle detection values θ1s and θ2s will be described. The first initial angle computing section 35 of the processor 30 computes θ1s by performing first arithmetic processing including, for example, Eq. (1) below.

$$\theta 1s = a\tan(S2/S1) \qquad (1)$$

Note that "a tan" represents an arctangent.

For θ1s ranging from 0° to less than 360°, Eq. (1) yields two solutions of θ1s that are 180° different in value. Which of the two solutions of θ1s in Eq. (1) is the true value of θ1s can be determined in accordance with the combination of the signs of S1 and S2. The first initial angle computing section 35 determines θ1s within the range of 0° to less than 360° in accordance with Eq. (1) and the determination on the combination of the signs of S1 and S2.

The second initial angle computing section 36 of the processor 30 computes θ2s by performing second arithmetic processing including, for example, Eq. (2) below.

$$\theta 2s = a\tan(S4/S3) \qquad (2)$$

For θ2s ranging from 0° to less than 360°, Eq. (2) yields two solutions of θ2s that are 180° different in value. Which of the two solutions of θ2s in Eq. (2) is the true value of θ2s can be determined in accordance with the combination of the signs of S3 and S4. The second initial angle computing section 36 determines θ2s within the range of 0° to less than 360° in accordance with Eq. (2) and the determination on the combination of the signs of S3 and S4.

The first arithmetic processing may include arithmetic processing for reducing error of θ1s computed in accordance with Eq. (1). Likewise, the second arithmetic processing may include arithmetic processing for reducing error of θ2s computed in accordance with Eq. (2).

Next, a method for computing the angle detection value θs will be described. To begin with, a description will be given of the relationship between the angles θ1, θ2 and the rotating field angle θM. If there is no noise magnetic field Mex, the angle θ1 is equal to the rotating field angle θM. If there is a noise magnetic field Mex, the direction of the first applied field component MF1c can deviate from that of the first partial magnetic field MFa, so that the angle θ1 can become different from the rotating field angle θM in value. A difference between the angle θ1 and the rotating field angle θM will hereinafter be referred to as an angle error of the angle θ1. The angle error of the angle θ1 is caused by the noise magnetic field Mex.

Likewise, if there is no noise magnetic field Mex, the angle θ2 is equal to the rotating field angle θM. If there is a noise magnetic field Mex, the direction of the second applied field component MF2c can deviate from that of the second partial magnetic field MFb, so that the angle θ2 can become different from the rotating field angle θM in value. A difference between the angle θ2 and the rotating field angle θM will hereinafter be referred to as an angle error of the angle θ2. The angle error of the angle θ2 is caused by the noise magnetic field Mex.

Figure 9:
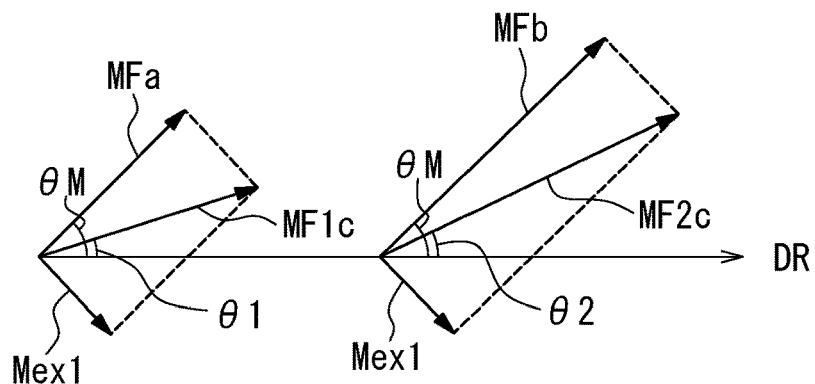
FIG. 9 is an explanatory diagram schematically illustrating a relationship between each of first and second applied field components and a noise magnetic field in the first embodiment of the invention.

Now, the noise magnetic field Mex will be discussed in terms of first to third components separately. A first component of the noise magnetic field Mex is a component in a direction parallel to the reference plane P and orthogonal to the directions of the first and second partial magnetic fields MFa and MFb. A second component of the noise magnetic field Mex is a component in a direction parallel to the directions of the first and second partial magnetic fields MFa and MFb. A third component of the noise magnetic field Mex is a component in a direction perpendicular to the reference plane P. FIG. 9 is an explanatory diagram schematically illustrating the relationship between each of the first and second applied field components MF1c and MF2c and the noise magnetic field Mex. In FIG. 9, the arrows Mex1 represent the first component of the noise magnetic field Mex. The magnitude of the first component Mex1 is exaggerated in FIG. 9. As shown in FIG. 9, the directions of the first and second applied field components MF1c and MF2c deviate from the directions of the first and second partial magnetic fields MFa and MFb, respectively, due to the effect of the first component Mex1.

In the present embodiment, it is assumed that the strength of the noise magnetic field Mex is sufficiently smaller than the strengths of the first and second partial magnetic fields MFa and MFb to the extent that the second component of the noise magnetic field Mex has a negligible effect on the directional deviations of the first and second applied field components MF1c and MF2c. Further, the third component of the noise magnetic field Mx does not affect the directions of the first and second applied field components MF1c and MF2c. In FIG. 9, the first applied field component MF1c is represented as a composite magnetic field of the first partial magnetic field MFa and the first component Mex1 of the noise magnetic field Mex, and the second applied field component MF2c is represented as a composite magnetic field of the second partial magnetic field MFb and the first component Mex1 of the noise magnetic field Mex.

As shown in FIG. 9, a deviation of the direction of the first applied field component MF1c from the direction of the first partial magnetic field MFa causes the angle θ1 to have an angle error. The angle error of the angle θ1 is a tan(Bex/B1), where B1 represents the strength of the first partial magnetic field MFa, and Bex represents the strength of the first component Mex1 of the noise magnetic field Mex.

As shown in FIG. 9, a deviation of the direction of the second applied field component MF2c from the direction of the second partial magnetic field MFb causes the angle θ2 to have an angle error. The angle error of the angle θ2 is a tan(Bex/B2), where B2 represents the strength of the second partial magnetic field MFb.

The angle θ1 is expressible using the rotating field angle θM and the angle error of the angle θ1. The angle θ2 is expressible using the rotating field angle θM and the angle error of the angle θ2. Specifically, the angles θ1 and θ2 are expressible in Eqs. (3) and (4) below, respectively.

$$\theta 1=\theta M-a\ \tan(Bex/B1) \qquad (3)$$

$$\theta 2=\theta M-a\ \tan(Bex/B2) \qquad (4)$$

When x is sufficiently small, a tan(x) can be approximated as AT*x. AT is a constant value, an example of which is 56.57. In the present embodiment, since the strength Bex of the first component Mex1 of the noise magnetic field Mex is sufficiently smaller than the strengths B1 and B2 of the first and second partial magnetic fields MFa and MFb, a tan(Bex/B1) can be approximated as AT*(Bex/B1), and a tan(Bex/B2) can be approximated as AT*(Bex/B2). Applying the approximation to Eq. (3) and rearranging the equation allows Bex to be expressed in Eq. (5) below.

$$Bex=-B1*(\theta 1-\theta M)/AT \qquad (5)$$

Applying the above-described approximation to Eq. (4) to rearrange the equation and further substituting Eq. (5) into the rearranged equation yields Eq. (6) below.

$$\theta 2=\theta M+B1*(\theta 1-\theta M)/B2 \qquad (6)$$

Rearranging Eq. (6) allows the rotating field angle θM to be expressed in Eq. (7) below.

$$\theta M=\{\theta 2-(B1/B2)*\theta 1\}/\{1-(B1/B2)\} \qquad (7)$$

In the present embodiment, the ratio of the strength of the detection-target magnetic field at the second detection position P2 to the strength of the detection-target magnetic field at the first detection position P1 is an important parameter related to the angle error of the angle detection value θs. The foregoing ratio is the same as the ratio B2/B1, i.e., the ratio of the strength B2 of the second partial magnetic field MFb to the strength B1 of the first partial magnetic field MFa. A ratio B1/B2, which is the reciprocal of the ratio B2/B1, is herein denoted by the symbol B12. The values of the ratio B2/B1 and the ratio B12 vary depending on the positional relationship between the first and second detection positions P1 and P2.

Next, the method by which the arithmetic processor 37 computes the angle detection value θs will be described concretely. In the present embodiment, the arithmetic processor 37 performs arithmetic processing using θ1s and θ2s, which are detection values of the angles θ1 and θ2, and the foregoing ratio B12. To be more specific, the arithmetic processor 37 performs arithmetic processing expressed in Eq. (8) below to thereby generate the angle detection value θs.

$$\theta s=(\theta 2s-B12*\theta 1s)/(1-B12) \qquad (8)$$

Eq. (8) results from replacing θM, θ1, θ2, and B1/B2 of Eq. (7) with θs, θ1s, θ2s, and B12, respectively.

The storage section 38 stores the ratio B12. The arithmetic processor 37 computes the angle detection value θs in accordance with Eq. (8) using: θ1s computed by the first initial angle computing section 35; θ2s computed by the second initial angle computing section 36; and the ratio B12 stored in the storage section 38.

θ1s is computed using the first and second detection values S1 and S2. θ2s is computed using the third and fourth detection values S3 and S4. Therefore, the arithmetic processing expressed in Eq. (8) is arithmetic processing using the first to fourth detection values S1 to S4, and is also arithmetic processing using the first and second detection information.

The ratio B12 can be determined by measurement of the strengths B1 and B2 of the first and second partial magnetic fields MFa and MFb. The measurement of the strengths B1 and B2 is performed by a control unit (not illustrated) outside the angle sensor 1 prior to shipment or use of the angle sensor 1. The measurement of the strengths B1 and B2 may be performed using the first and second magnetic sensors 10 and 20 or other magnetic sensors.

According to the present embodiment, performing the arithmetic processing using the first and second detection information enables generation of the angle detection value θs which contains lower angle error caused by the noise magnetic field Mex as compared to the case of generating the angle detection value θs based on only either the first detection information or the second detection information. The reason therefor will be described in detail below.

As is apparent from Eq. (3), the angle θ1 varies depending on the angle error "a tan(Bex/B1)" caused by the noise magnetic field Mex. As is apparent from Eq. (4), the angle θ2 varies depending on the angle error "a tan(Bex/B2)" caused by the noise magnetic field Mex.

In the present embodiment, the strength B1 of the first partial magnetic field MFa and the strength B2 of the second partial magnetic field B2 are different from each other. As a result, there occurs a difference dependent on the noise magnetic field Mex between the values of the angle errors of the angles θ1 and θ2. The rotating field angle θM expressed in Eq. (7) is led using this characteristic. In the present embodiment, the angle detection value θs is generated by performing the arithmetic processing using the first detection information and the second detection information, more specifically, the arithmetic processing expressed in Eq. (8).

θ1s and θ2s, which are detection values of the angles θ1 and θ2, respectively, each correspond to an angle detection value that is generated based on only either the first detection information or the second detection information. Since the angles θ1 and θ2 contain angle errors caused by the noise magnetic field Mex as described above, θ1s and θ2s also contain similar angle errors. On the other hand, since the rotating field angle θM contains no angle error caused by the noise magnetic field Mex, the angle detection value θs generated by performing the arithmetic processing expressed in Eq. (8) theoretically contains no angle error caused by the noise magnetic field Mex. The present embodiment thus enables generation of the angle detection value θs with reduced angle error caused by the noise magnetic field Mex as compared to the angles θ1s and θ2s.

Effects of the present embodiment will now be described with reference to the results of a first simulation. In the first simulation, a first model of the angle sensor system 100 was used to determine respective angle errors of θ1s, θ2s, and θs when θ1s, θ2s, and θs were generated in the presence of a noise magnetic field Mex having a constant direction and strength.

The magnetic structure 6 of the first model has the following configuration. The first portion 61 is 6 mm in outer diameter. The first portion 61 is 2 mm in thickness T1 (see FIG. 4). The second portion 62 is 6 mm in outer diameter D (see FIG. 4). The second portion 62 is 2 mm in inner diameter d (see FIG. 4). The second portion 62 is 1 mm in thickness T2 (see FIG. 4). The residual magnetic flux density corresponding to the magnetization of the magnetic structure 6 is 0.615 T.

The positional relationships among the magnetic structure 6, the rotation axis C, the reference plane P, the first detection position P1 and the second detection position P2 for the first model are as follows. The second end face 6b of the magnetic structure 6 is at a distance of 0.5 mm from the reference plane P. Both the first and second detection positions P1 and P2 are in the reference plane P. The first detection position P1 is a point of intersection of the reference plane P and the rotation axis C. The second detection position P2 is at a distance of 2.4 mm from the rotation axis C. In the first simulation, the magnetic flux density corresponding to the strength of the noise magnetic field Mex is 5 mT.

Figure 10:
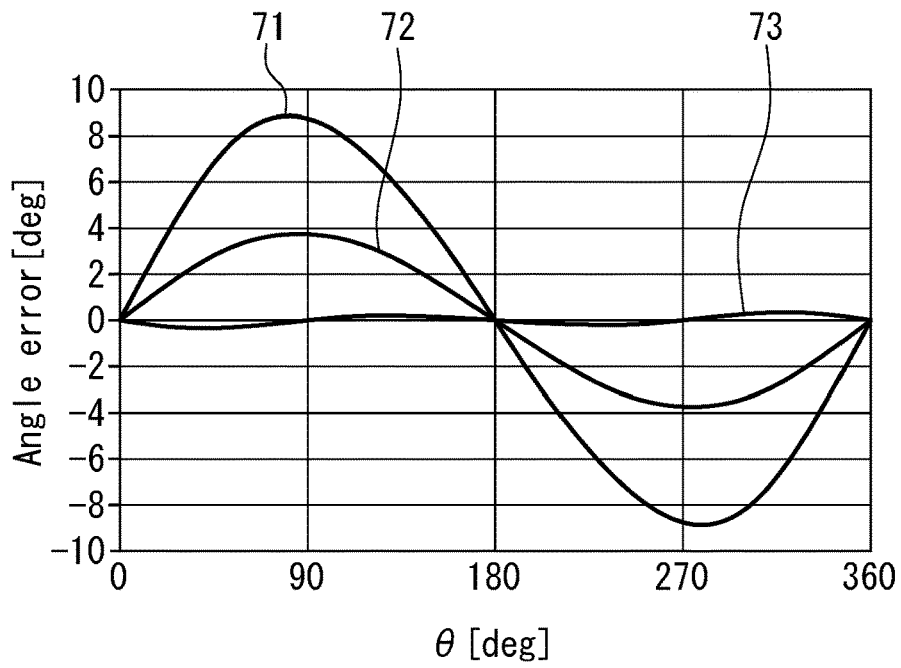
FIG. 10 is a waveform diagram illustrating an example of waveforms of angle errors obtained by a first simulation.

FIG. 10 is a waveform diagram illustrating an example of angle errors of θ1s, θ2s, and θs obtained by the first simulation. In FIG. 10 the horizontal axis represents the detection-target angle θ, and the vertical axis represents the angle error. The reference numeral 71 represents the angle error of θ1s. The reference numeral 72 represents the angle error of θ2s. The reference numeral 73 represents the angle error of θs. As shown in FIG. 10, the angle error of θs is extremely lower than the angle error of each of θ1s and θ2s. The angle errors of θ1s and θ2s are caused mainly by the noise magnetic field Mex. The results of the first simulation indicate that the present embodiment enables generation of an angle detection value θs achieving reduction of angle error caused by the noise magnetic field Mex.

Next, a second simulation will be described. In the second simulation, a second model of the angle sensor system 100 was used to determine a relationship between the ratio B2/B1, i.e., the ratio of the strength B2 of the second partial magnetic field MFb to the strength B1 of the first partial magnetic field MFa, and the angle error of the angle detection value θs. Hereinafter, unless otherwise specified, an angle error refers to a maximum value of angle errors resulting with the detection-target angle θ varied over a range of 360°. The second model is the same as the first model except that the distance from the rotation axis C to the second detection position P2 is 1.9 mm. In the second simulation, the ratio B2/B1 was varied by varying the strength B1 of the first partial magnetic field MFa with the strength B2 of the second partial magnetic field MFb kept constant. The other conditions of the second simulation were the same as those of the first simulation.

Figure 11:
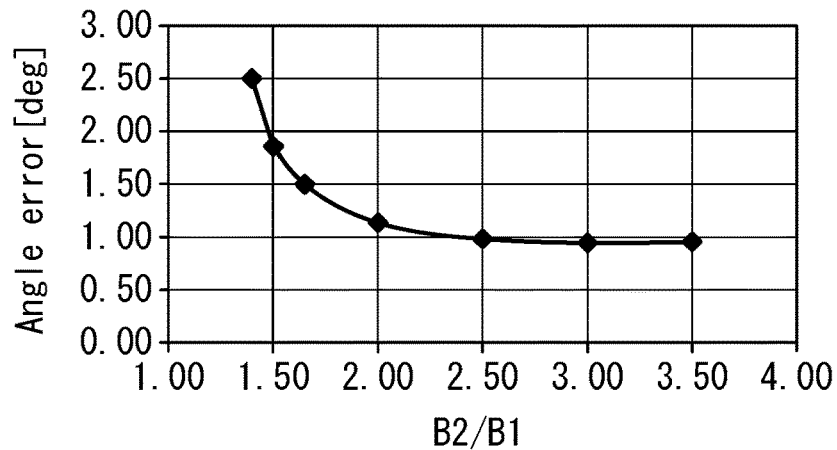
FIG. 11 is a characteristic chart illustrating the results of a second simulation.

FIG. 11 is a characteristic chart illustrating the relationship between the ratio B2/B1 and the angle error of the angle detection value θs obtained by the second simulation. In FIG. 11 the horizontal axis represents B2/B1, and the vertical axis represents the angle error. As shown in FIG. 11, in the range of B2/B1 up to 2.5, the angle error increases as B2/B1 approaches 1. In the range of B2/B1 not less than 2.5, the angle error hardly changes with changing B2/B1.

A reason why the angle error increases as B2/B1 approaches 1 in the range of B2/B1 up to 2.5 is considered to be as follows. The angle detection value θs determined in the present embodiment corresponds to an angle that the direction of a difference vector between the vector representing the second applied field component MF2c and the vector representing the first applied field component MF1c shown in FIG. 9 forms with respect to the reference direction DR. As B2/B1 approaches 1, the magnitude of the foregoing difference vector decreases, and as a result, the signal-to-noise ratio of the angle detection value θs decreases to increase the angle error.

The angle error is preferably 1.5° or less. FIG. 11 indicates that the angle error can be reduced to 1.5° or less by setting B2/B1 to 1.65 or more. B2/B1 is therefore preferably 1.65 or more. To further reduce the angle error, B2/B1 is more preferably 2 or more, yet more preferably 2.5 or more.

The angle error of θ1s corresponding to the angle error of the angle θ1 will be denoted by the symbol AE1. The angle error of θ2s corresponding to the angle error of the angle θ2 will be denoted by the symbol AE2. The angle error AE1 can be approximated as AT*(Bex/B1). The angle error AE2 can be approximated as AT*(Bex/B2). AE1/AE2 is thus approximately equal to B2/B1. B2/B1 being preferably 1.65 or more therefore means that AE1/AE2 is preferably 1.65 or more.

Examples of requirements for a typical angle sensor to satisfy include a requirement that the angle error be less than or equal to a predetermined value when a magnetic flux density corresponding to the strength of the detection-target magnetic field falls within a predetermined range in the absence of a noise magnetic field. The foregoing predetermined range is 20 mT to 80 mT, for example. The requirement that the angle error be less than or equal to a predetermined value when the magnetic flux density is in the range of 20 mT to 80 mT in the absence of a noise magnetic field will hereinafter be referred to as a normal error requirement.

In the present embodiment, the first magnetic sensor 10, the A/D converters 31 and 32, and the first initial angle computing section 35 can be regarded as constituting a single angle sensor. In this context, a portion of the angle sensor 1 that is constituted of the first magnetic sensor 10, the A/D converters 31 and 32 and the first initial angle computing section 35 will be referred to as a first angle sensor portion. Likewise, the second magnetic sensor 20, the A/D converters 33 and 34, and the second initial angle computing section 36 can be regarded as constituting another single angle sensor. In this context, another portion of the angle sensor 1 that is constituted of the second magnetic sensor 20, the A/D converters 33 and 34 and the second initial angle computing section 36 will be referred to as a second angle sensor portion.

Assume that the first and second angle sensor portions satisfy the normal error requirement. In this case, if the magnetic flux density corresponding to the strength B1 of the first partial magnetic field MFa is in the range of 20 mT to 80 mT, the first initial angle detection value θ1s in the absence of the noise magnetic field Mex falls at or below the predetermined value defined by the normal error requirement. Similarly, if the magnetic flux density corresponding to the strength B2 of the second partial magnetic field MFb is in the range of 20 mT to 80 mT, the second initial angle detection value θ2s in the absence of the noise magnetic field Mex falls at or below the predetermined value defined by the normal error requirement.

In the present embodiment, both the magnetic flux density corresponding to the strength B1 of the first partial magnetic field MFa and the magnetic flux density corresponding to the strength B2 of the second partial magnetic field MFb are preferably in the range of 20 mT to 80 mT. To satisfy such a requirement, B2/B1 needs to be 4 or less. B2/B1 is thus preferably 4 or less.

As can be seen from the above, a preferred requirement for B1 and B2 in the present embodiment is that both the magnetic flux density corresponding to B1 and the magnetic flux density corresponding to B2 be in the range of 20 mT to 80 mT and B2/B1 be 1.65 or more and not more than 4.

Next, a third simulation will be described. In the third simulation, a third model of the angle sensor system 100 was used to examine a distribution of magnetic flux densities on an imaginary straight line in the reference plane P, the imaginary straight line passing through the point of intersection of the reference plane P and the rotation axis C, by varying T1/T2, i.e., the ratio of the thickness T1 (see FIG. 4) of the first position 61 to the thickness T2 (see FIG. 4) of the second portion 62. The point of intersection of the reference plane P and the rotation axis C will hereinafter be referred to as a point of origin. Any point on the foregoing imaginary straight line will be referred to as a measurement point. The position of the measurement point is expressed as the distance from the point of origin to the measurement point. The magnetic flux density at a measurement point corresponds to the strength of the detection-target magnetic field at the measurement point. The third model is the same as the first model except that the thickness T1 of the first portion 61 of the magnetic structure 6 is a variable value. In the third simulation, the ratio T1/T2 was varied by varying the thickness T1 of the first portion 61 to be 0.9 mm, 1 mm, 2 mm, and 3 mm with the thickness T2 of the second portion 62 fixed at 1 mm. The other conditions of the third simulation were the same as those of the first simulation.

Figure 12:
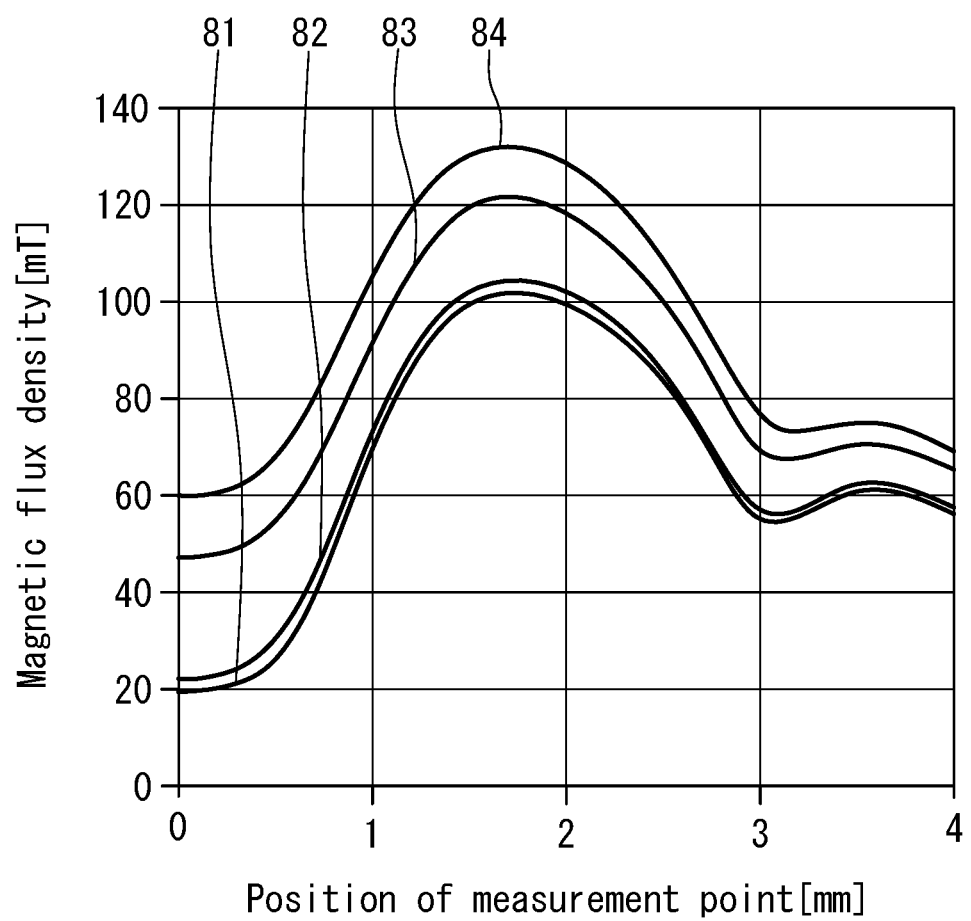
FIG. 12 is a characteristic chart illustrating the results of a third simulation.

FIG. 12 is a characteristic chart illustrating a relationship between the ratio T1/T2 and the magnetic flux density obtained by the third simulation. In FIG. 12, the horizontal axis represents the position of the measurement point, and the vertical axis represents the magnetic flux density. In FIG. 12, the curve designated by the reference numeral 81 shows the magnetic flux density in the case where T1/T2=0.9. The curve designated by the reference numeral 82 shows the magnetic flux density in the case where T1/T2=1. The curve designated by the reference numeral 83 shows the magnetic flux density in the case where T1/T2=2. The curve designated by the reference numeral 84 shows the magnetic flux density in the case where T1/T2=3. As shown in FIG. 12, the magnetic flux density at any point on the foregoing imaginary straight line increases with increasing T1/T2.

As described above, it is the preferred requirement for B1 and B2 in the present embodiment that both the magnetic flux density corresponding to B1 and the magnetic flux density corresponding to B2 be in the range of 20 mT to 80 mT and B2/B1 be 1.65 or more and not more than 4. With T1/T2 falling within the range employed in the third simulation, it is possible, regardless of the value of T1/T2, to dispose the first and second magnetic sensors 10 and 20 such that the foregoing requirement is satisfied and the first and second detection positions P1 and P2 are in the reference plane P. In particular, if T1/T2 is 1 or more, it is possible to dispose the first magnetic sensor 10 such that the first detection position P1 coincides with the point of origin. This facilitates the positioning of the first magnetic sensor 10. T1/T2 is thus preferably 1 or more.

If T1/T2 is 0.9 (the reference numeral 81), the first magnetic sensor 10 may be disposed such that, for example, the first detection position P1 coincides with a point (other than the point of origin) in the reference plane P at which the magnetic flux density reaches or exceeds 20 mT. This makes it possible to dispose the first and second magnetic sensors 10 and 20 in the reference plane P such that the foregoing requirement is satisfied and the first and second detection positions P1 and P2 are in the reference plane P.

Next, a fourth simulation will be described. In the fourth simulation, a fourth model of the angle sensor system 100 was used to examine a distribution of magnetic flux densities on the foregoing imaginary straight line by varying d/D, i.e., the ratio of the inner diameter d (see FIG. 4) of the second portion 62 to the outer diameter D (see FIG. 4) of the second portion 62. The fourth model is the same as the first model except that the inner diameter d of the second portion 62 of the magnetic structure 6 is a variable value. In the fourth simulation, the ratio d/D was varied by varying the inner diameter d of the second portion 62 in the range from 1 to 5.2 mm in 0.2 mm increments with the outer diameter D of the second portion 62 fixed at 6 mm. The other conditions of the fourth simulation were the same as those of the first simulation.

Figure 13:
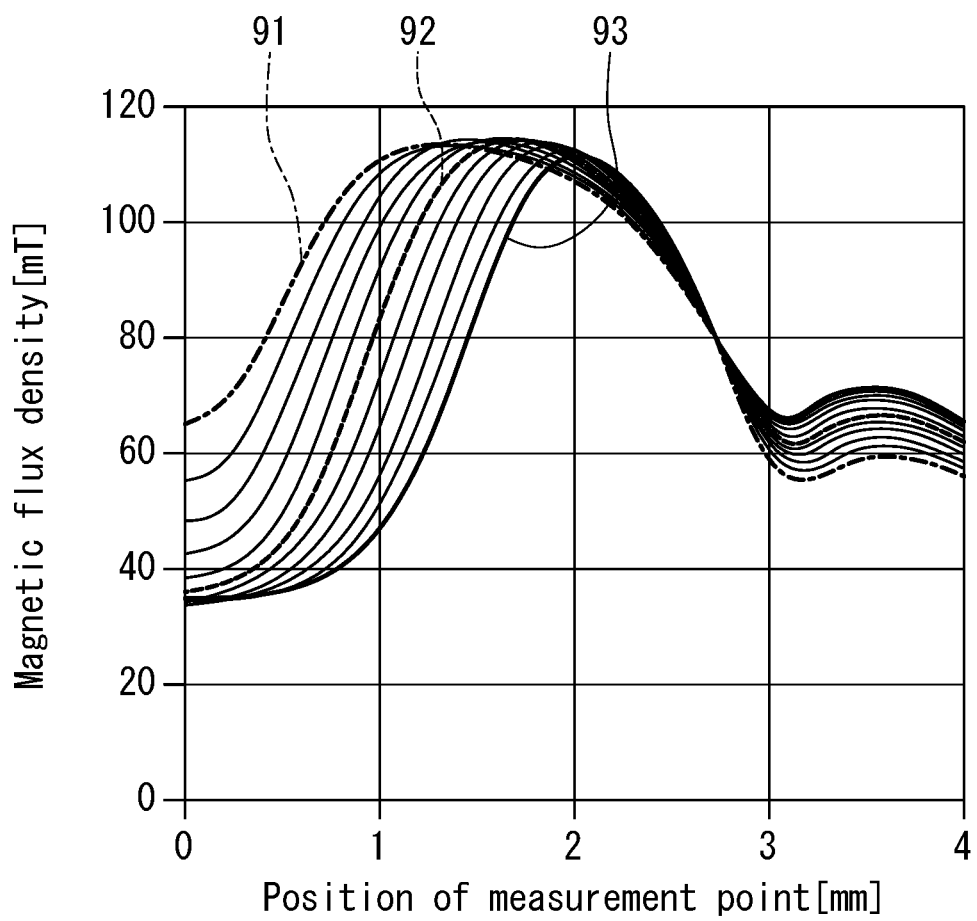
FIG. 13 is a characteristic chart illustrating the results of a fourth simulation.
Figure 14:
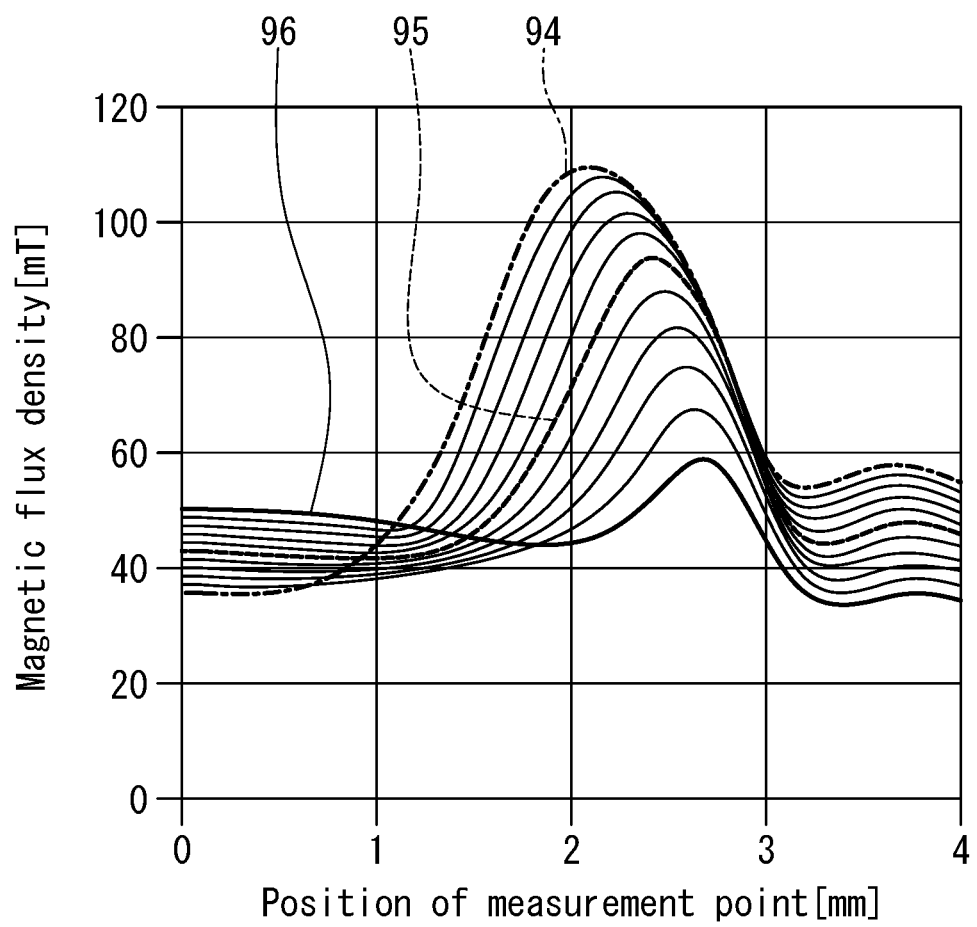
FIG. 14 is a characteristic chart illustrating the results of the fourth simulation.

FIGS. 13 and 14 are characteristic charts illustrating a relationship between the ratio d/D and the magnetic flux density obtained by the fourth simulation. In FIGS. 13 and 14, the horizontal axis represents the position of the measurement point, and the vertical axis represents the magnetic flux density. The curves drawn in FIG. 13 show the magnetic flux densities when d/D is in the range of 0.17 to 0.50. The curves drawn in FIG. 14 show the magnetic flux densities when d/D is in the range of 0.53 to 0.87. In FIGS. 13 and 14, only some of the curves are designated by reference numerals.

In FIG. 13, the curve designated by the reference numeral 91 shows the magnetic flux density in the case where d/D=0.17. The curve designated by the reference numeral 92 shows the magnetic flux density in the case where d/D=0.33. The curve designated by the reference numeral 93 shows the magnetic flux density in the case where d/D=0.50. As shown in FIG. 13, the magnetic flux density at a measurement point varies depending on d/D. For example, in the range of d/D from 0.17 to 0.50, the magnetic flux density at the measurement point at the 1-mm position decreases with increasing d/D.

In FIG. 14, the curve designated by the reference numeral 94 shows the magnetic flux density in the case where d/D=0.53. The curve designated by the reference numeral 95 shows the magnetic flux density in the case where d/D=0.70. The curve designated by the reference numeral 96 shows the magnetic flux density in the case where d/D=0.87. As shown in FIG. 14, the magnetic flux density at a measurement point varies depending on d/D. For example, in the range of d/D from 0.53 to 0.87, the magnetic flux density at the measurement point at the 2-mm position decreases with increasing d/D.

Now, for each value of d/D, a measurement point at which the magnetic flux density takes a minimum value Bmin and a measurement point at which the magnetic flux density takes a maximum value Bmax will be considered. The measurement point at which the magnetic flux density takes a minimum value Bmin will hereinafter be referred to as a minimum flux density point. The measurement point at which the magnetic flux density takes a maximum value Bmax will be referred to as a maximum flux density point. As shown in FIGS. 13 and 14, the minimum flux density point is not limited to the point of origin.

The minimum flux density point is a candidate for the first detection position P1. However, the first detection position P1 need not necessarily coincide with the minimum flux density point. If Bmin is 20 mT or more, the first detection position P1 can be selected so that the magnetic flux density corresponding to B1 is 20 mT or more. Bmin is therefore preferably 20 mT or more.

On the other hand, assume that B2/B1 is 1.65 or more. In this case, when Bmin exceeds 80/1.65, i.e., 48.5 mT, there no longer is a measurement point to be a candidate for the second detection position P2, i.e., where the magnetic flux density corresponding to B2 is 80 mT or less. Bmin is therefore preferably 48.5 mT or less.

To set B2/B1 to 1.65 or more, Bmax/Bmin needs to be 1.65 or more.

In view of the foregoing, a preferred requirement for the magnetic structure 6 in the present embodiment is to generate a detection-target magnetic field such that Bmin is 20 mT or more and not more than 48.5 mT and Bmax/Bmin is 1.65 or more in the reference plane P.

Figure 15:
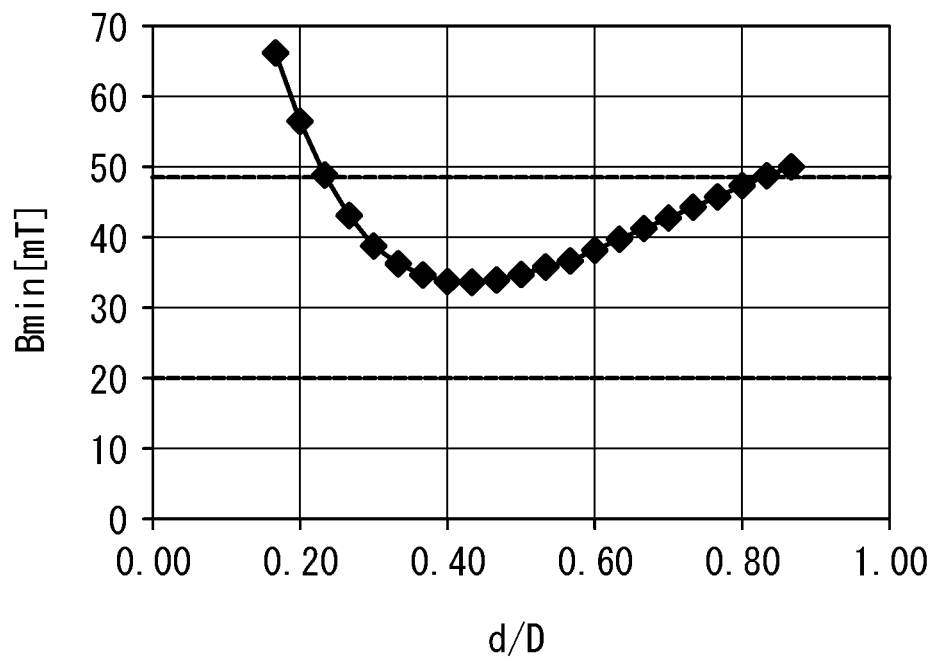
FIG. 15 is a characteristic chart illustrating a characteristic derived from the results shown in FIG. 13 and FIG. 14.

FIG. 15 is a characteristic chart illustrating a relationship between d/D and Bmin derived from the results shown in FIGS. 13 and 14. In FIG. 15, the horizontal axis represents d/D, and the vertical axis represents Bmin. In FIG. 15, broken lines are drawn at positions where Bmin is 20 mT and where Bmin is 48.5 mT. From FIG. 15, it can be seen that Bmin falls within the range of 20 mT to 48.5 mT if d/D is in the range of 0.23 to 0.8.

Figure 16:
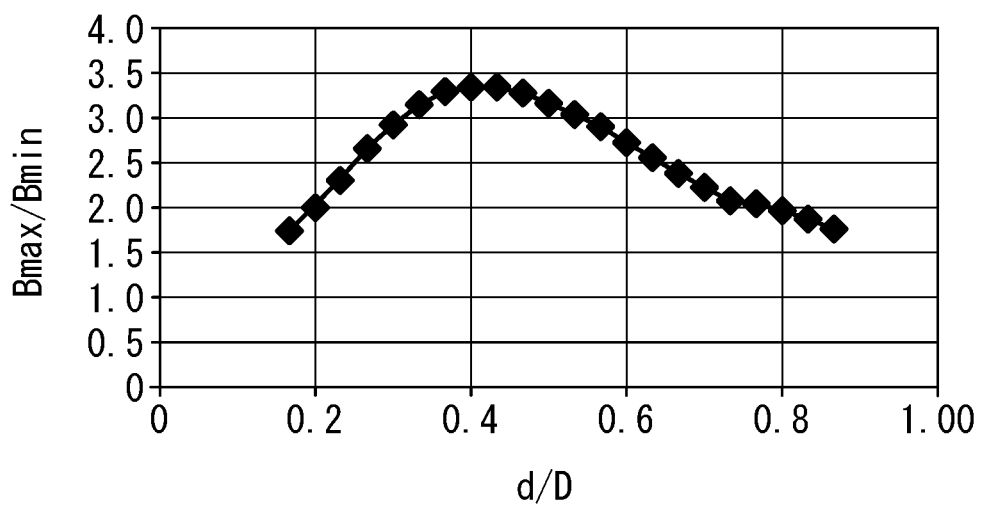
FIG. 16 is a characteristic chart illustrating a characteristic derived from the results shown in FIG. 13 and FIG. 14.

FIG. 16 is a characteristic chart illustrating a relationship between d/D and Bmax/Bmin derived from the results shown in FIGS. 13 and 14. In FIG. 16, the horizontal axis represents d/D, and the vertical axis represents Bmax/Bmin. Bmax/Bmin is 1.65 or more when d/D is in the range shown in FIG. 16.

The results shown in FIGS. 15 and 16 suggest that a preferred range of d/D is from 0.23 to 0.8.

Next, a fifth simulation will be described. In the fifth simulation, a distribution of magnetic flux densities on the foregoing imaginary straight line was examined using a fifth model of the angle sensor system 100. The fifth model includes, instead of the magnetic structure 6, a magnetic structure made up only of the first portion 61 of the magnetic structure 6.

The magnetic structure of the fifth model has a first end face and a second end face opposite to each other in a direction parallel to the rotation axis C. The second end face faces the reference plane P. The distance between the second end face of the magnetic structure of the fifth model and the reference plane P is 0.5 mm. The magnetic structure of the fifth model has a magnetization in a direction perpendicular to the rotation axis C. The residual magnetic flux density corresponding to the magnetization of the magnetic structure of the fifth model is 0.615 T.

The definitions of the outer diameter and the thickness of the magnetic structure of the fifth model are the same as those of the outer diameter and the thickness T1 of the first portion 61, respectively. Hereinafter, the thickness of the magnetic structure of the fifth model will be denoted by the symbol T3. In the fifth simulation, the thickness T3 of the magnetic structure of the fifth model was varied to be 1 mm, 2 mm, and 3 mm, with the outer diameter fixed at 6 mm.

Figure 17:
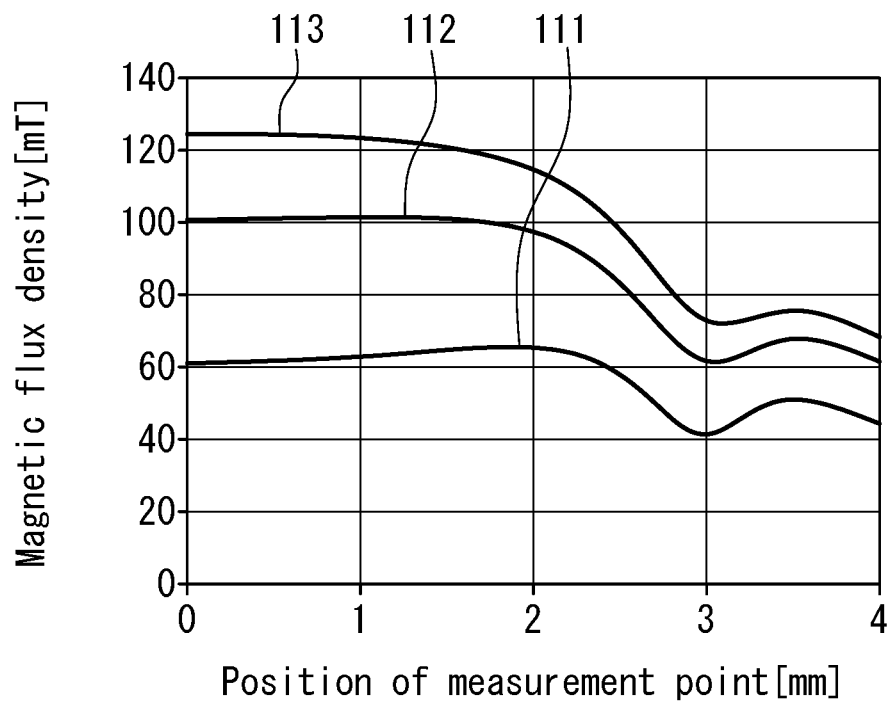
FIG. 17 is a characteristic chart illustrating the results of a fifth simulation.

FIG. 17 is a characteristic chart illustrating a relationship between the thickness T3 and the magnetic flux density obtained by the fifth simulation. In FIG. 17, the horizontal axis represents the position of the measurement point, and the vertical axis represents the magnetic flux density. In FIG. 17, the curve designated by the reference numeral 111 shows the magnetic flux density in the case where the thickness T3 is 1 mm. The curve designated by the reference numeral 112 shows the magnetic flux density in the case where the thickness T3 is 2 mm. The curve designated by the reference numeral 113 shows the magnetic flux density in the case where the thickness T3 is 3 mm. As shown in FIG. 17, the magnetic flux density at the same measurement point increases with increasing thickness T3.

As can be seen from FIG. 17, if the magnetic structure of the fifth model is used, it is not possible to dispose the first and second magnetic sensors 10 and 20 such that the foregoing preferred requirement for B1 and B2 is satisfied and the first and second detection positions P1 and P2 are in the reference plane P. However, the foregoing preferred requirement for B1 and B2 can be satisfied by, for example, disposing the first and second magnetic sensors 10 and 20 at different distances from the magnetic structure of the fifth model. For example, to satisfy the foregoing preferred requirement for B1 and B2, the angle sensor system may be configured with the first magnetic senor 10 disposed farther from the magnetic structure of the fifth model than the second magnetic sensor 20.

If the magnetic structure of the fifth model is used, however, the first and second magnetic sensor 10 and 20 cannot be disposed in the same plane. This increases the dimension of the angle sensor system 100 in a direction parallel to the rotation axis C. In contrast, if the magnetic structure 6 including the first portion 61 and the second portion 62 is used, the first and second magnetic sensors 10 and 20 can be disposed in the same plane. This makes it possible to reduce the dimension of the angle sensor system 100 in a direction parallel to the rotation axis C.

Next, a sixth simulation will be described. In the sixth simulation, a distribution of magnetic flux densities on the foregoing imaginary straight line was examined using a sixth model of the angle sensor system 100. The sixth model includes, instead of the magnetic structure 6, a magnetic structure made up only of the second portion 62 of the magnetic structure 6.

The magnetic structure of the sixth model has a first end face and a second end face opposite to each other in a direction parallel to the rotation axis C. The second end face faces the reference plane P. The distance between the second end face of the magnetic structure of the sixth model and the reference plane P is 0.5 mm. The magnetic structure of the sixth model has a magnetization in a direction perpendicular to the rotation axis C. The residual magnetic flux density corresponding to the magnetization of the magnetic structure of the sixth model is 0.615 T.

The definitions of the outer diameter, the inner diameter, and the thickness of the magnetic structure of the sixth model are the same as those of the outer diameter D, the inner diameter d, and the thickness T2 of the second portion 62, respectively. Hereinafter, the thickness of the magnetic structure of the sixth model will be denoted by the symbol T4. In the sixth simulation, the thickness T4 of the magnetic structure of the sixth model was varied to be 1 mm, 2 mm, 3 mm, and 4 mm, with the outer diameter and the inner diameter fixed at 6 mm and 2 mm, respectively.

Figure 18:
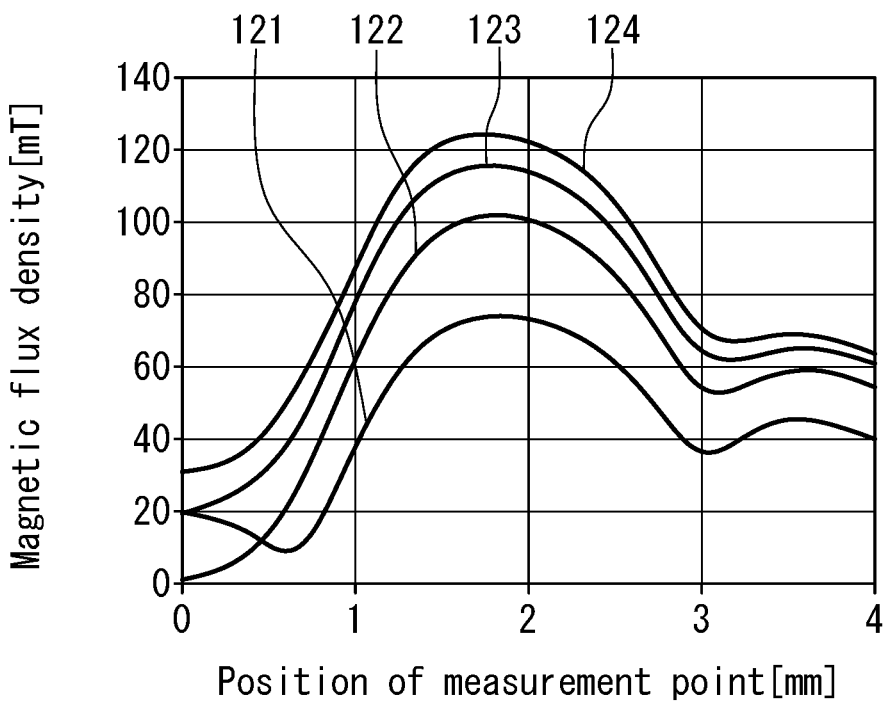
FIG. 18 is a characteristic chart illustrating the results of a sixth simulation.

FIG. 18 is a characteristic chart illustrating a relationship between the thickness T4 and the magnetic flux density obtained by the sixth simulation. In FIG. 18, the horizontal axis represents the position of the measurement point, and the vertical axis represents the magnetic flux density. In FIG. 18, the curve designated by the reference numeral 121 shows the magnetic flux density in the case where the thickness T4 is 1 mm. The curve designated by the reference numeral 122 shows the magnetic flux density in the case where the thickness T4 is 2 mm. The curve designated by the reference numeral 123 shows the magnetic flux density in the case where the thickness T4 is 3 mm. The curve designated by the reference numeral 124 shows the magnetic flux density in the case where the thickness T4 is 4 mm. As shown in FIG. 18, the magnetic flux density at the same measurement point increases with increasing thickness T4, except at and near the point of origin.

As can be seen from FIG. 18, if the magnetic structure of the sixth model is used, it is possible to dispose the first and second magnetic sensors 10 and 20 such that the foregoing preferred requirement for B1 and B2 is satisfied and the first and second detection positions P1 and P2 are in the reference plane P. For example, if the thickness T4 is 4 mm, the first magnetic sensor 10 can be disposed such that the first detection position P1 coincides with the point of origin. If the thickness T4 is 1 mm, 2 mm, or 3 mm, the foregoing preferred requirement for B1 and B2 can be satisfied by, for example, disposing the first magnetic sensor 10 such that the first detection position P1 coincides with a point (other than the point of origin) in the reference plane P at which the magnetic flux density falls within the range of 20 mT to 48.5 mT.

As seen from FIGS. 12 and 18, a comparison between the magnetic structure 6 of the third model and the magnetic structure of the sixth model given the same thickness shows that the magnetic structure 6 of the third model provides a higher magnetic flux density at and near the point of origin. Thus, if a comparison is made by setting the first detection positions P1 at or near the point of origin and setting B1 at the same value, it is seen that the magnetic structure 6 of the third model can be smaller in thickness than the magnetic structure of the sixth model. The dimension of the angle sensor system 100 in a direction parallel to the rotation axis C can thus be reduced by using the magnetic structure 6 including the first portion 61 and the second portion 62, compared to the case of using the magnetic structure of the sixth model.

Second Embodiment

Figure 19:
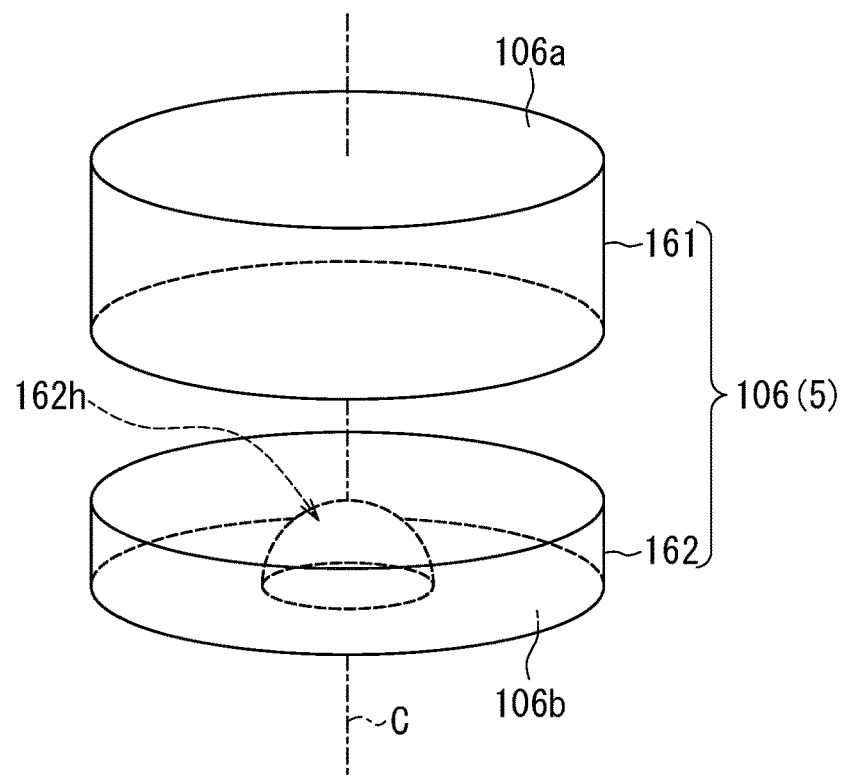
FIG. 19 is an exploded perspective view of a magnetic structure of a second embodiment of the invention.
Figure 20:
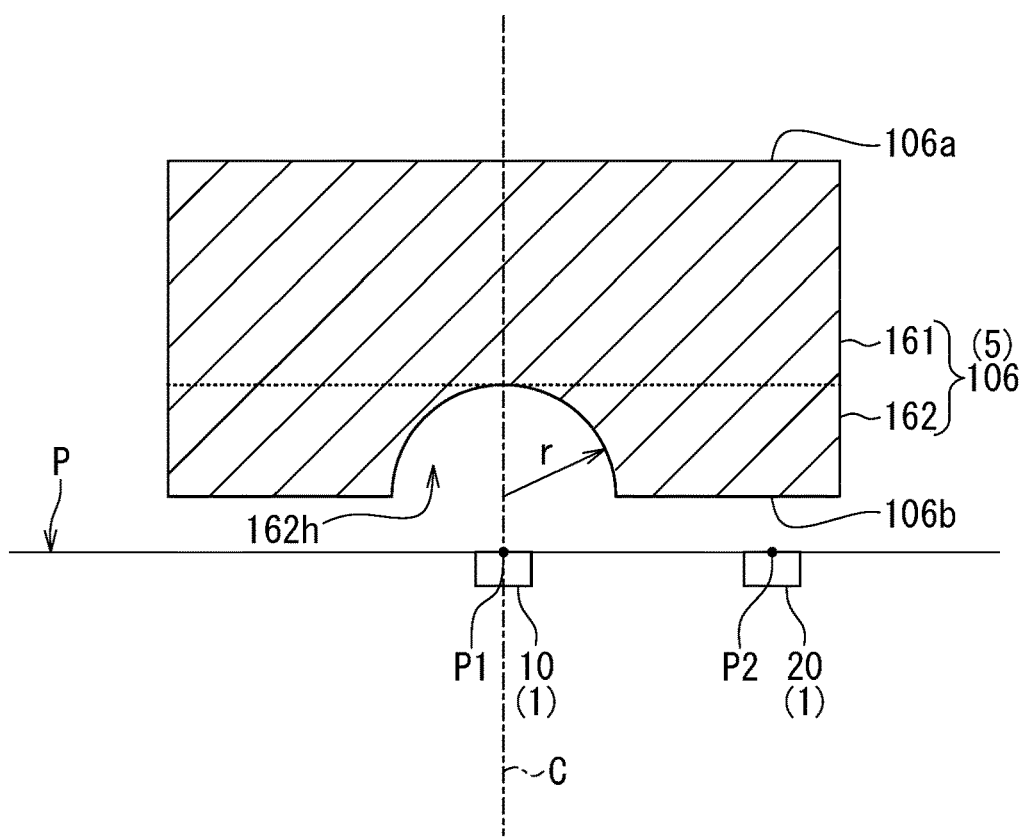
FIG. 20 is a cross-sectional view of the magnetic structure of the second embodiment of the invention.

A second embodiment of the present invention will now be described with reference to FIGS. 19 and 20. FIG. 19 is an exploded perspective view of a magnetic structure of the second embodiment. FIG. 20 is a cross-sectional view of the magnetic structure of the second embodiment. In the second embodiment, the magnetic field generator 5 includes a magnetic structure 106 formed of a magnetic material, instead of the magnetic structure 6 of the first embodiment. The magnetic structure 106 is formed in its entirety of a hard magnetic material. The magnetic structure 106 has a magnetization in a direction perpendicular to the rotation axis C, and rotates around the rotation axis C.

The magnetic structure 106 has a first end face 106a and a second end face 106b opposite to each other in a direction parallel to the rotation axis C. The second end face 106b faces the reference plane P. In the present embodiment the first end face 106a and the second end face 106b are both perpendicular to the rotation axis C.

The magnetic structure 106 includes a first portion 161 and a second portion 162 coupled to each other. FIG. 19 depicts the first portion 161 and the second portion 162 as separate from each other. In FIG. 20 the boundary between the first portion 161 and the second portion 162 is shown by a dotted line. The first portion 161 includes the first end face 106a. The second portion 162 includes the second end face 106b. The first and second portions 161 and 162 are arranged in the same manner as the first and second portions 61 and 62 of the magnetic structure 6 of the first embodiment.

As shown in FIGS. 19 and 20, the second portion 162 includes a cavity 162h through which the rotation axis C passes, whereas the first portion 161 does not include any cavity through which the rotation axis C passes.

In the present embodiment, the second portion 162 is shaped as follows. The second portion 162 has an outer periphery and an inner periphery each of which has a circular shape centered on the rotation axis C in any cross section of the second portion 162 perpendicular to the rotation axis C. The diameter of the outer periphery of the second portion 162 in the foregoing cross section will hereinafter be referred to as the outer diameter of the second portion 162. The diameter of the inner periphery of the second portion 162 in the foregoing cross section will be referred to as the inner diameter of the second portion 162. In the present embodiment, the outer diameter of the second portion 162 is constant regardless of the distance from the second end face 106b.

The inner diameter of the second portion 162 is the largest at the second end face 106b, and decreases with increasing distance from the second end face 106b. In particular, in the present embodiment, the cavity 162h is in the shape of a hemisphere centered on the point of intersection of an imaginary plane including the second end face 106b and the rotation axis C. The radius of this hemisphere will hereinafter be referred to as the radius of the cavity 162h and denoted by the symbol r. A dimension of the second portion 162 in a direction parallel to the rotation axis C will be referred to as the thickness of the second portion 162.

The first portion 161 has a shape similar to that of the first portion 61 of the first embodiment. The diameter of the outer periphery of the first portion 161 in any cross section of the first portion 161 perpendicular to the rotation axis C will be referred to as the outer diameter of the first portion 161. A dimension of the first portion 161 in a direction parallel to the rotation axis C will be referred to as the thickness of the first portion 161.

Next, a seventh simulation will be described. A seventh model of the angle sensor system 100 according to the present embodiment was used in the seventh simulation. The configuration of the magnetic structure 106 of the seventh model and the positional relationship between the magnetic structure 106 and the reference plane P are as follows. The first portion 161 and the second portion 162 are 6 mm in outer diameter. The residual magnetic flux density corresponding to the magnetization of the magnetic structure 106 is 0.615 T. The distance between the second end face 106b of the magnetic structure 106 and the reference plane P is 0.5 mm.

In the seventh simulation, a distribution of magnetic flux densities on an imaginary straight line lying in the reference plane P and passing through the point of origin was examined for each of the following first and second cases. In the first case, the thickness of the first portion 161 was set at 2 mm and both the thickness of the second portion 162 and the radius r of the cavity 162h were set at 1 mm. In the second case, the thickness of the first portion 161, the thickness of the second portion 162, and the radius r of the cavity 162h were all set at 1.5 mm.

Figure 21:
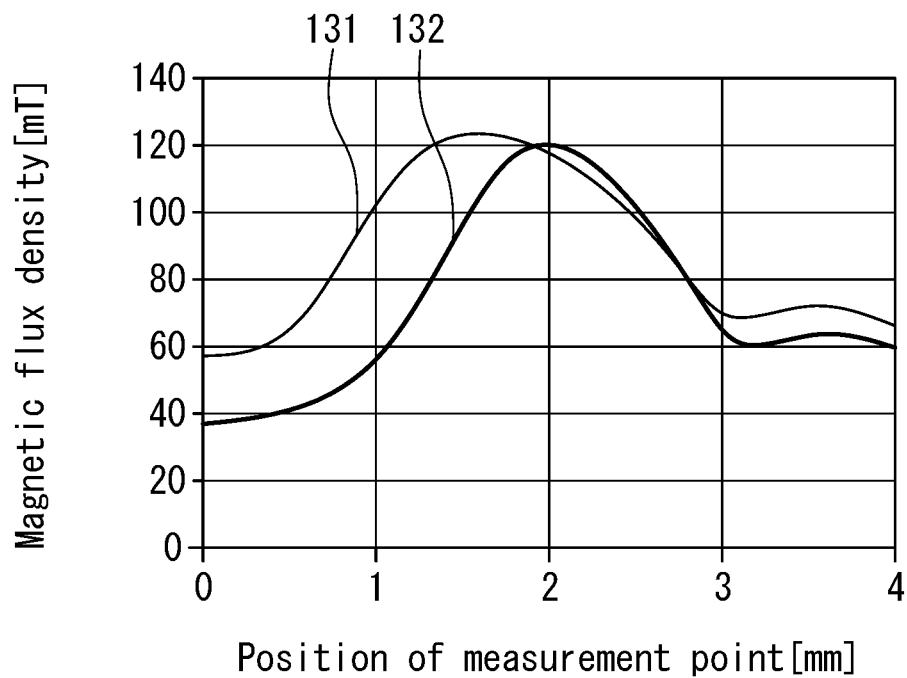
FIG. 21 is a characteristic chart illustrating the results of a seventh simulation.

FIG. 21 is a characteristic chart illustrating the magnetic flux densities obtained by the seventh simulation. In FIG. 21, the horizontal axis represents the position of the measurement point, and the vertical axis represents the magnetic flux density. In FIG. 21, the curve designated by the reference numeral 131 shows the magnetic flux density in the first case. The curve designated by the reference numeral 132 shows the magnetic flux density in the second case.

A preferred requirement for the magnetic structure 106 is the same as that for the magnetic structure 6 of the first embodiment. As shown in FIG. 21, the first case (the reference numeral 131) does not satisfy the preferred requirement for the magnetic structure 106, whereas the second case (the reference numeral 132) satisfies the preferred requirement for the magnetic structure 106.

The preferred requirement for B1 and B2 in the present embodiment is the same as in the first embodiment. As can be seen from FIG. 21, the second case (the reference numeral 132) makes it possible to dispose the first and second magnetic sensors 10 and 20 such that the preferred requirement for B1 and B2 is satisfied and the first and second detection positions P1 and P2 are in the reference plane P. Furthermore, in the second case (the reference numeral 132), it is possible to dispose the first magnetic sensor 10 such that the first detection position P1 coincides with the point of origin.

In the first case (the reference numeral 131), the preferred requirement for B1 and B2 can be satisfied by, for example, disposing the first and second magnetic sensors 10 at different distances from the magnetic structure 106. For example, the angle sensor system may be configured with the first magnetic sensor 10 disposed at a greater distance from the magnetic structure 106 than the second magnetic sensor 20 so as to satisfy the preferred requirement for B1 and B2.

The configuration, operation and effects of the present embodiment are otherwise the same as those of the first embodiment.

Third Embodiment

Figure 22:
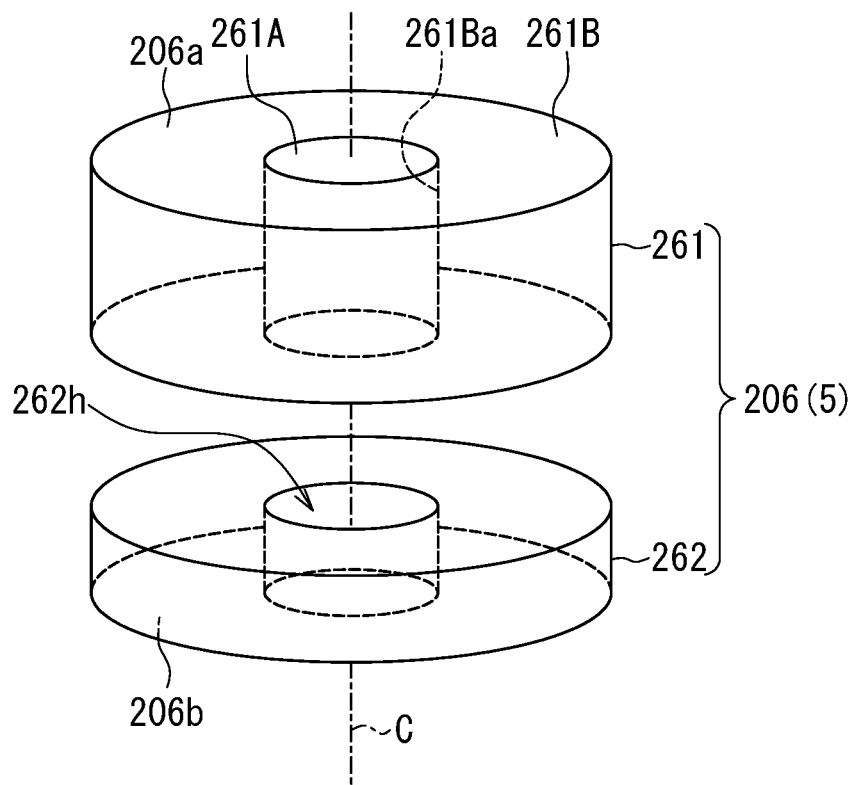
FIG. 22 is an exploded perspective view of a magnetic structure of a third embodiment of the invention.
Figure 23:
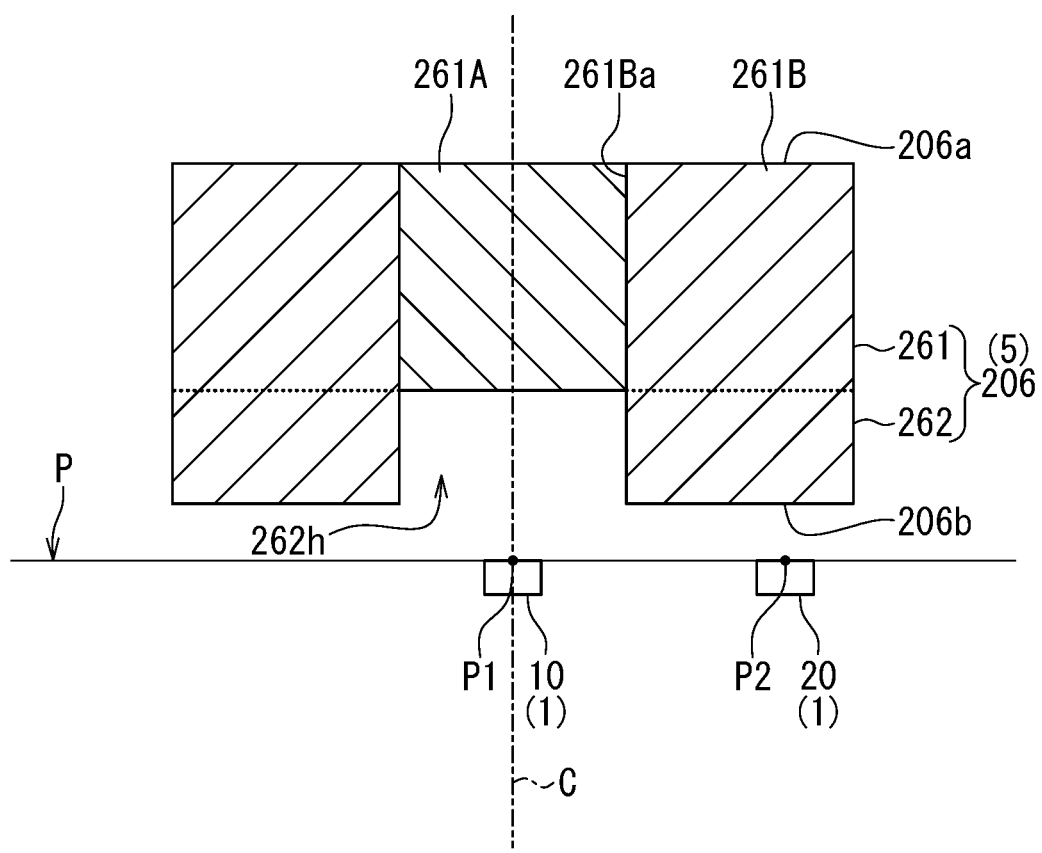
FIG. 23 is a cross-sectional view of the magnetic structure of the third embodiment of the invention.

A third embodiment of the present invention will now be described with reference to FIGS. 22 and 23. FIG. 22 is an exploded perspective view of a magnetic structure of the third embodiment. FIG. 23 is a cross-sectional view of the magnetic structure of the third embodiment. In the third embodiment, the magnetic field generator 5 includes a magnetic structure 206 formed of a magnetic material, instead of the magnetic structure 6 of the first embodiment. The magnetic structure 206 has a magnetization in a direction perpendicular to the rotation axis C, and rotates around the rotation axis C.

The magnetic structure 206 has a first end face 206a and a second end face 206b opposite to each other in a direction parallel to the rotation axis C. The second end face 206b faces the reference plane P. In the present embodiment the first end face 206a and the second end face 206b are both perpendicular to the rotation axis C.

The magnetic structure 206 includes a first portion 261 and a second portion 262 coupled to each other. FIG. 22 depicts the first portion 261 and the second portion 262 as separate from each other. In FIG. 23 the boundary between the first portion 261 and the second portion 262 is shown by a dotted line. The first portion 261 includes the first end face 206a. The second portion 262 includes the second end face 206b. The first and second portions 261 and 262 are arranged in the same manner as the first and second portions 61 and 62 of the magnetic structure 6 of the first embodiment.

As shown in FIGS. 22 and 23, the second portion 262 includes a cavity 262h through which the rotation axis C passes, whereas the first portion 261 does not include any cavity through which the rotation axis C passes.

The second portion 262 has the same shape as the second portion 62 of the first embodiment. The diameter of the outer periphery of the second portion 262 in any cross section of the second portion 262 perpendicular to the rotation axis C will hereinafter be referred to as the outer diameter of the second portion 262. The diameter of the inner periphery of the second portion 262 in the foregoing cross section will be referred to as the inner diameter of the second portion 262. A dimension of the second portion 262 in a direction parallel to the rotation axis C will be referred to as the thickness of the second portion 262.

The first portion 261 includes a soft magnetic material portion 261A formed of a soft magnetic material, and a hard magnetic material portion 261B formed of a hard magnetic material. An example of the soft magnetic material is Fe. The hard magnetic material portion 261B includes an accommodation portion 261Ba through which the rotation axis C passes. The soft magnetic material portion 261A is accommodated in the accommodation portion 261Ba.

In the present embodiment, the hard magnetic material portion 261B is shaped as follows. The hard magnetic material portion 261B has an outer periphery and an inner periphery each of which has a circular shape centered on the rotation axis C in any cross section of the hard magnetic material portion 261B perpendicular to the rotation axis C. The diameter of the outer periphery of the hard magnetic material portion 261B in the foregoing cross section will hereinafter be referred to as the outer diameter of the hard magnetic material portion 261B. The diameter of the inner periphery of the hard magnetic material portion 261B in the foregoing cross section will be referred to as the inner diameter of the hard magnetic material portion 261B. In the present embodiment, both the outer diameter and the inner diameter of the hard magnetic material portion 261B are constant regardless of the distance from the first end face 206a. A dimension of the hard magnetic material portion 261B in a direction parallel to the rotation axis C will be referred to as the thickness of the hard magnetic material portion 261B.

In the present embodiment, the soft magnetic material portion 261A has a cylindrical shape with its central axis on the rotation axis C. The diameter of an outer periphery of the soft magnetic material portion 261A in any cross section of the soft magnetic material portion 261A perpendicular to the rotation axis C will hereinafter be referred to as the outer diameter of the soft magnetic material portion 261A. In the present embodiment, the outer diameter of the soft magnetic material portion 261A is constant regardless of the distance from the first end face 206a, and is equal to the inner diameter of the hard magnetic material portion 261B. A dimension of the soft magnetic material portion 261A in a direction parallel to the rotation axis C will be referred to as the thickness of the soft magnetic material portion 261A.

The soft magnetic material portion 261A may be part of a shaft rotating around the rotation axis C. In such a case, a hard magnetic structure constituted of the hard magnetic material portion 261B and the second portion 262 may be formed using a hard magnetic material, and the part of the shaft may be fitted into the accommodation portion 261Ba to construct a magnetic structure 206 integrated with the shaft.

Next, an eighth simulation will be described. An eighth model of the angle sensor system 100 according to the present embodiment was used in the eighth simulation. The configuration of the magnetic structure 206 of the eighth model and the positional relationship between the magnetic structure 206 and the reference plane P are as follows. The hard magnetic material portion 261B and the second portion 262 are 6 mm in outer diameter. The inner diameter of the hard magnetic material portion 261B, the outer diameter of the soft magnetic material portion 261A, and the inner diameter of the second portion 262 are 2 mm. The second portion 262 is 1 mm in thickness. The residual magnetic flux density corresponding to the magnetization of the magnetic structure 206 is 0.615 T. The distance between the second end face 206b of the magnetic structure 206 and the reference plane P is 0.5 mm.

In the eighth simulation, a distribution of magnetic flux densities on an imaginary straight line lying in the reference plane P and passing through the point of origin was examined for each of the following third, fourth and fifth cases. In the third case, both the thickness of the hard magnetic material portion 261B and the thickness of the soft magnetic material portion 261A were set at 1 mm. In the fourth case, both the thickness of the hard magnetic material portion 261B and the thickness of the soft magnetic material portion 261A were set at 2 mm. In the fifth case, both the thickness of the hard magnetic material portion 261B and the thickness of the soft magnetic material portion 261A were set at 3 mm.

Figure 24:
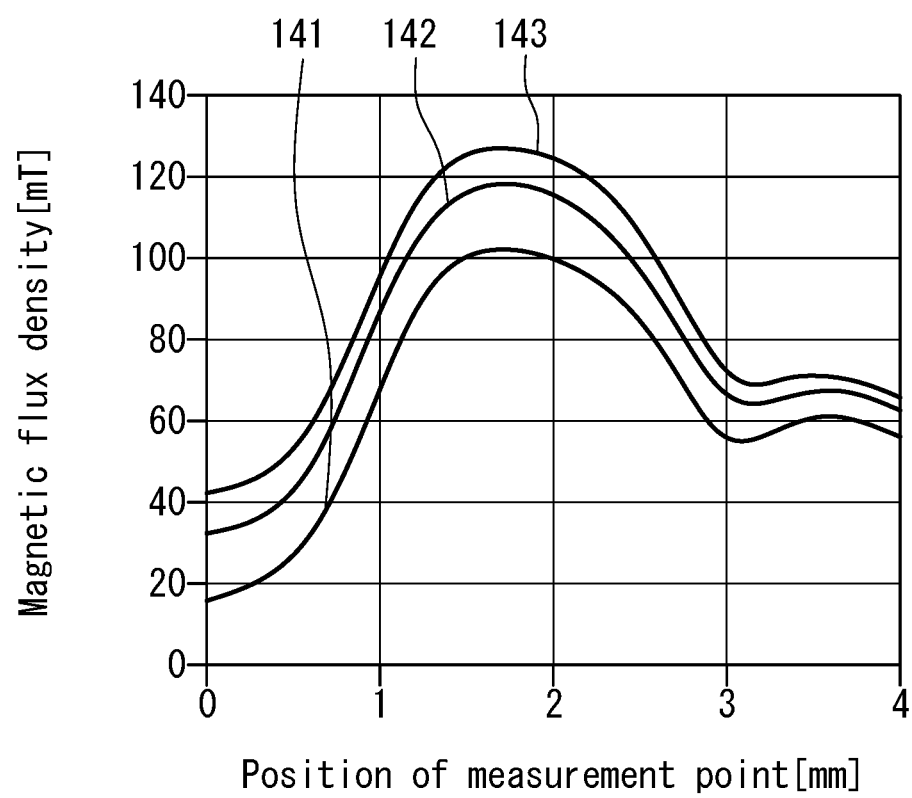
FIG. 24 is a characteristic chart illustrating the results of an eighth simulation.

FIG. 24 is a characteristic chart illustrating the magnetic flux densities obtained by the eighth simulation. In FIG. 24, the horizontal axis represents the position of the measurement point, and the vertical axis represents the magnetic flux density. In FIG. 24, the curve designated by the reference numeral 141 shows the magnetic flux density in the third case. The curve designated by the reference numeral 142 shows the magnetic flux density in the fourth case. The curve designated by the reference numeral 143 shows the magnetic flux density in the fifth case.

A preferred requirement for the magnetic structure 206 is the same as that for the magnetic structure 6 of the first embodiment. As shown in FIG. 24, the third case (the reference numeral 141) does not satisfy the preferred requirement for the magnetic structure 206, whereas the fourth case (the reference numeral 142) and the fifth case (the reference numeral 143) satisfy the preferred requirement for the magnetic structure 206.

The preferred requirement for B1 and B2 in the present embodiment is the same as in the first embodiment. As can be seen from FIG. 24, all the third to fifth cases (the reference numeral 132) make it possible to dispose the first and second magnetic sensors 10 and 20 such that the preferred requirement for B1 and B2 is satisfied and the first and second detection positions P1 and P2 are in the reference plane P. In the fourth case (the reference numeral 142) and the fifth case (the reference numeral 143), in particular, it is possible to dispose the first magnetic sensor 10 such that the first detection position P1 coincides with the point of origin. In the third case (the reference numeral 141), the preferred requirement for B1 and B2 can be satisfied by, for example, disposing the first magnetic sensor 10 such that the first detection position P1 coincides with a point (other than the point of origin) in the reference plane P at which the magnetic flux density falls within the range of 20 mT to 48.5 mT.

The configuration, operation and effects of the present embodiment are otherwise the same as those of the first embodiment.

The present invention is not limited to the foregoing embodiments, and various modifications may be made thereto. For example, possible configurations of the magnetic structure are not limited to the examples illustrated in the foregoing embodiments. The magnetic structure is preferably such that the preferred requirement for the magnetic structure 6 described in relation to the first embodiment is satisfied. Even if the magnetic structure fails to satisfy the preferred requirement, however, the angle sensor system can sometimes be configured to satisfy the preferred requirement for B1 and B2, as has been described in relation to the foregoing embodiments.

Specific operations in the arithmetic processing for generating the angle detection value θs are not limited to those described in relation to the first embodiment. For example, assume that the first detection value S1 has a correspondence with the strength of a component in the X direction of the first applied field component MF1c, the second detection value S2 has a correspondence with the strength of a component in the Y direction of the first applied field component MF1c, the third detection value S3 has a correspondence with the strength of a component in the X direction of the second applied field component MF2c, and the fourth detection value S4 has a correspondence with the strength of a component in the Y direction of the second applied field component MF2c. In such a case, the angle detection value θs may be generated by performing the following operations. Initially, S3−S1 is determined as Sa, and S4−S2 is determined as Sb. Then, a tan(Sb/Sa) is determined as θs.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:
1. An angle sensor system comprising:
   a magnetic field generator that is configured to generate a detection-target magnetic field that is a magnetic field to be detected and is related to an angle to be detected; and an angle sensor that is configured to detect the detection-target magnetic field and generate an angle detection value having a correspondence with the angle to be detected, wherein the angle sensor includes:
- a first magnetic sensor that is configured to detect, at a first detection position, a first applied magnetic field including the detection-target magnetic field, and generate first detection information having a correspondence with the angle to be detected;
- a second magnetic sensor that is configured to detect, at a second detection position, a second applied magnetic field including the detection-target magnetic field, and generate second detection information having a correspondence with the angle to be detected; and
- a processor that is configured to generate the angle detection value by performing arithmetic processing using the first detection information and the second detection information, the magnetic field generator is configured to rotate such that, at each of the first and second detection positions, a direction of the detection-target magnetic field rotates with the angle to be detected, a strength of the detection-target magnetic field that rotates at the first detection position is a first strength and a strength of the detection-target magnetic field that rotates at the second detection position is a second strength, the first magnetic sensor and the second magnetic sensor are positioned and configured such that a ratio of the second strength to the first strength is 1.65 or more, a rotating field angle has a correspondence with the angle to be detected, the rotating field angle being an angle that the direction of the detection-target magnetic field at a reference position forms with respect to a reference direction in a reference plane, the angle detection value has a correspondence with the rotating field angle, the first and second detection positions are in the reference plane, the magnetic field generator is disposed at a distance from the reference plane, the magnetic field generator includes a magnetic structure formed of a magnetic material, the magnetic structure having a magnetization in a direction perpendicular to a rotation axis and rotating around the rotation axis, the first detection position and the second detection position are located on a same side of the magnetic structure in a direction parallel to the rotation axis, and at different distances from the rotation axis, the magnetic structure includes a first portion and a second portion coupled to each other, the second portion being located between the first portion and the first and second detection positions in the direction parallel to the rotation axis, and the second portion includes a cavity through which the rotation axis passes, whereas the first portion does not include any cavity through which the rotation axis passes.

2. The angle sensor system according to claim 1, wherein the ratio of the second strength to the first strength is 4 or less.

3. The angle sensor system according to claim 1, wherein the first detection information has a correspondence with an angle that a direction of a first applied field component forms with respect to the reference direction, the first applied field component being a component of the first applied magnetic field parallel to the reference plane, and the second detection information has a correspondence with an angle that a direction of a second applied field component forms with respect to the reference direction, the second applied field component being a component of the second applied magnetic field parallel to the reference plane.

4. The angle sensor system according to claim 3, wherein the first detection information includes a first detection value having a correspondence with a cosine of the angle that the direction of the first applied field component forms with respect to the reference direction, and a second detection value having a correspondence with a sine of the angle that the direction of the first applied field component forms with respect to the reference direction, and the second detection information includes a third detection value having a correspondence with a cosine of the angle that the direction of the second applied field component forms with respect to the reference direction, and a fourth detection value having a correspondence with a sine of the angle that the direction of the second applied field component forms with respect to the reference direction.

5. The angle sensor system according to claim 4, wherein as the direction of the detection-target magnetic field rotates with a predetermined period, all the first to fourth detection values vary periodically with the predetermined period.

6. The angle sensor system according to claim 1, wherein the first portion is shaped like a circular plate, and
the second portion has an outer periphery and an inner periphery each of which has a circular shape in any cross section of the second portion perpendicular to the rotation axis.

7. The angle sensor system according to claim 1, wherein the magnetic structure is formed in its entirety of a hard magnetic material.

8. The angle sensor system according to claim 1, wherein the first portion includes a soft magnetic material portion formed of a soft magnetic material and a hard magnetic material portion formed of a hard magnetic material,
the hard magnetic material portion includes an accommodation portion through which the rotation axis passes, and
the soft magnetic material portion is accommodated in the accommodation portion.

9. The angle sensor system according to claim 1, wherein as viewed in the direction parallel to the rotation axis, the first detection position is located to overlap the cavity of the second portion and the second detection position is located to overlap the second portion excluding the cavity.

10. The angle sensor system according to claim 1, wherein an entirety of the magnetic field generator is located anterior to the first magnetic sensor and the second magnetic sensor in a direction perpendicular to the reference plane.

11. The angle sensor system according to claim 1, wherein the direction of the detection-target magnetic field at the first detection position and the direction of the detection-target magnetic field at the second detection position rotate with a same period.

12. The angle sensor system according to claim 1, wherein an entirety of the magnetic field generator is spaced from the reference plane.

13. An angle sensor system comprising:
a magnetic field generator that is configured to generate a detection-target magnetic field that is a magnetic field to be detected and related to an angle to be detected; and
an angle sensor that is configured to detect the detection-target magnetic field and generate an angle detection value having a correspondence with the angle to be detected,
the angle sensor including:
a first magnetic sensor that is configured to detect, at a first detection position, a first applied magnetic field including the detection-target magnetic field, and generate first detection information having a correspondence with the angle to be detected;
a second magnetic sensor that is configured to detect, at a second detection position, a second applied magnetic field including the detection-target magnetic field, and generate second detection information having a correspondence with the angle to be detected; and
a processor that is configured to generate the angle detection value by performing arithmetic processing using the first detection information and the second detection information, wherein
at each of the first and second detection positions, a direction of the detection-target magnetic field changes with the angle to be detected,
the detection-target magnetic field has a first strength at the first detection position and a second strength at the second detection position, a ratio of the second strength to the first strength is 1.65 or more,
the magnetic field generator includes a magnetic structure formed of a magnetic material, the magnetic structure having a magnetization in a direction perpendicular to a rotation axis and rotating around the rotation axis,
the first detection position and the second detection position are located on a same side of the magnetic structure in a direction parallel to the rotation axis, and at different distances from the rotation axis,
the magnetic structure includes a first portion and a second portion coupled to each other, the second portion being located between the first portion and the first and second detection positions in the direction parallel to the rotation axis,
the second portion includes a cavity through which the rotation axis passes, whereas the first portion does not include any cavity through which the rotation axis passes,
the first portion includes a soft magnetic material portion formed of a soft magnetic material and a hard magnetic material portion formed of a hard magnetic material,
the hard magnetic material portion includes an accommodation portion through which the rotation axis passes, and
the soft magnetic material portion is accommodated in the accommodation portion.

* * * * *